(12) United States Patent
Sumiya et al.

(10) Patent No.: US 6,396,047 B1
(45) Date of Patent: May 28, 2002

(54) SENSOR FOR DETECTING A QUANTITY OF LIGHT INCIDENT ON A VEHICLE

(75) Inventors: Kazuyoshi Sumiya, Hekinan; Norihiro Katayama, Obu; Keiji Horiba, Nishikasugai-gun, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/441,958

(22) Filed: Nov. 17, 1999

(30) Foreign Application Priority Data

Nov. 19, 1998 (JP) .......................................... 10-329668
Mar. 8, 1999 (JP) .......................................... 11-060283

(51) Int. Cl.[7] ................................................ H01J 40/14
(52) U.S. Cl. ............................ 250/214 R; 250/203.3; 250/203.4; 356/141.5
(58) Field of Search ........................... 250/214 R, 216, 250/237 R, 203.1–203.4, 208.1, 206, 206.1, 206.2; 356/141.5, 139.01–139.03; 257/431–435; 165/203, 42; 236/91 C

(56) References Cited

U.S. PATENT DOCUMENTS 4,315,690 A * 2/1982 Trocellier et al. ...... 356/139.03
5,072,105 A * 12/1991 Osawa ..................... 250/206.1
5,181,654 A * 1/1993 Yoshimi et al. ........... 236/91 C
5,567,976 A * 10/1996 Dierschke et al. .......... 257/443

* cited by examiner

Primary Examiner—Que T. Le
Assistant Examiner—Thanh X. Luu
(74) Attorney, Agent, or Firm—Harness, Dickey & Pierce, PLC

(57) ABSTRACT

A sensor for detecting a quantity of light has a housing, which has an axis along a direction in which light enters with an azimuth of 0°. A right side photodetector is disposed on a left side of the axis, and a left side photodetector is disposed on a right side of the axis. A central photodetector is disposed on the axis with a sensitivity, which is lowered as compared to those of the right side and left side photodetectors. A right side light signal is obtained by outputs from the right side photodetector and the central photodetector, and a left side light signal is obtained by outputs from the left side photodetector and the central photodetector. Accordingly, an adverse effect by a positional shift between a shading member disposed above the photodetectors and the photodetectors is lessened.

19 Claims, 20 Drawing Sheets

SENSOR FOR DETECTING A QUANTITY OF LIGHT INCIDENT ON A VEHICLE

CROSS REFERENCE TO RELATED APPLICATIONS

This application is based upon and claims the benefit of Japanese Patent Applications No. 10-329668 filed on Nov. 19, 1998, and No. 11-60283 filed on Mar. 8, 1999, the contents of which are incorporated herein by reference.

BACKGROUND OF THE INVENTION

1. Field of the Invention

This invention relates to a sensor for detecting a quantity of light, which is applied to an automotive air conditioner, particularly to an air conditioning system capable of independently air-conditioning left and right sides of a vehicle.

2. Description of the Related Art

A so-called zone air-conditioning method (left-light side independently air-conditioning method) is a method for controlling an automotive air conditioner using a sensor, which detects a quantity (intensity) and a direction of solar radiation, to independently air-condition left and right sides in a vehicle compartment.

As the sensor capable of detecting the quantity and direction of solar radiation, a 2D (two elements) type sensor has been developed. Referring to FIG. 22, the 2D type sensor has a left side detecting element (photodetector) 51 disposed at a right side of an axis $L_{cent}$, which is a reference of 0° in aximuth, and a right side detecting element (photodetector) 52 disposed at a left side of the axis $L_{cent}$. A shading member 54 having a through hole 53 is disposed above the detecting elements 51, 52. The right side detecting element 51 and the left side detecting element 52 receive light from the right side and the left side of the axis $L_{cent}$, respectively, and output signals corresponding to quantities of light. When azimuth Ø is 0°, 30°, 60°, or 90° as shown in FIGS. 24A to 24D, output ratios are as shown in FIG. 23. When azimuth Ø is 0°, right side and left side output ratios $CR_R$, $CR_L$ are 0.50, respectively. The left side and right side output ratios $CR_L$, $CR_R$ are represented by the following formulas:

$CR_L$=(left side detecting element output current×R)/(the sum of left side and right side detecting element output currents×R)

$CR_R$=(right side detecting element output current×R)/(the sum of left side and right side detecting element output currents×R)

In FIG. 23, shift between the shading member and the photodetectors is zero. Here, a relationship in position between the shading member 54 and the photodetectors 51, 52 is important to exhibit desirable characteristics, and is required to have an assembling accuracy of several tens μm. When positional shift of, for example, 0.1 mm occurs among the members, output ratios are as shown in FIG. 25. In this case, light irradiated parts when azimuth Ø is 0°, 30°, 60° and 90° are as shown in FIGS. 26A to 26D. When azimuth Ø is 0°, right side and left side output ratios $CR_R$, $CR_L$ are 0.60, 0.40, respectively. Thus, when the positional shift occurs between the shading member 54, and the photodetectors 51, 52, there arises a large difference between the left side and right side output ratios, thereby causing malfunctions when left side and right sides in the compartment are independently air-conditioned. Further, requiring high accuracy for processing the parts inevitably results in high cost.

JP-A-7-43145 proposes a technique for forming a shading film by printing black epoxy resin on a transparent substrate disposed above a photodetector. A light transmittance hole is formed at the central portion of the shading film. Accordingly, the shading member is positioned with respect to the photodetector with high accuracy. However, this technique requires to visually recognize the photodetector when the resin is printed, resulting in low workability and low processing yield.

SUMMARY OF THE INVENTION

The present invention has been made in view of the above problems. An object of the present invention is to lessen an adverse effect caused by a positional shift between a shading member and a photodetector with desirable detection characteristics.

Here, detection characteristics required for a sensor will be explained. Elevation and azimuth are determined as shown in FIG. 27. FIG. 28 specifically indicates a relationship between the azimuth and a quantity of heat received by a vehicle when the sun moves from the front to the right side of the vehicle with the elevation of 40°. The quantity of heat received by the vehicle becomes the maximum when the azimuth is 60°, and decreases in the order of 90°, 30°, and 0° azimuths. When the azimuth is in a range of 0° to 30°, the change in quantity of heat received by the vehicle is small, and sunlight is delivered uniformly to passengers. With this azimuth range, it is assumed that a difference in quantity of solar radiation between the left side and the right side is small. On the other hand, when the azimuth is larger than approximately 30°, the difference in quantity of solar radiation aimed to the passengers is large.

Accordingly, as shown in FIG. 29, it is desirable for the sensor that sensor outputs from the right and left sides are approximately equal to each other when the azimuth is in a range of 0° to 30°, and abruptly change (increase or decrease) when the azimuth is in a range of 30° to 60°. That is, the difference between the outputs from the right and left sides is not required when light enters from a vehicle front with the azimuth in a range of 0° to 30°. The difference between the outputs from the right and left sides is required to be large when the azimuth is larger than approximately ±30°.

To achieve the above object with the desirable characteristics, according to the present invention, a sensor for detecting a quantity of light has a housing having an axis along a direction in which light enters the sensor when an azimuth is zero. The axis divides a surface of the housing into a first region and a second region. A first photodetector is disposed on the second region of the housing, and a second photodetector is disposed on the first region of the housing. A central photodetector is further disposed on both the first region and the second region across the axis. A sensitivity of the central photodetector is lowered as compared to those of the first and second photodetectors. A first quantity of light entering the sensor from a side of the first region is cooperatively detected by the first photodetector and the central photodetector, and a second quantity of light entering the sensor from a side of the second region is cooperatively detected by the second photodetector and the central photodetector.

Accordingly, when the sensor is mounted on a vehicle to detect quantities of light incident on right and left seats of the vehicle, the right and left seats can be independently air-conditioned based on the quantities of light detected by the sensor. In addition, because the sensitivity in the vicinity of the axis is blunted (lowered) by the central photodetector having a low sensitivity, even if a positional shift occurs between a shading member disposed above the housing and the photodetectors, output signals corresponding to the first and second quantities of light are less susceptible to the positional shift.

In other words, when the azimuth is small, light is incident on the vicinity of the axis. In this case, a difference between the output signals corresponding to the first and second quantities of light is small. When the azimuth increases, the difference between the output signals also increases, thereby approaching ideal detection characteristics.

When the detection of the quantities of light is performed without using the central photodetector, the first photodetector has a plurality of first protrusions protruding from the second region toward the first region across the axis, and the second photodetector has a plurality of second protrusions protruding from the first region toward the second region across the axis. The plurality of first protrusions extend on the first region with a first width from the axis together with the plurality of second protrusions, and the plurality of second protrusions extend on the second region with a second width from the axis together with the plurality of first protrusions. Accordingly, the sensitivity of the vicinity of the axis is blunted, thereby achieving the effects described above.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS

First Embodiment

A sensor for detecting a quantity of light in a first preferred embodiment is useful for an automatic air conditioning system of a vehicle air conditioner. The automatic air conditioning system independently controls temperatures of air toward left side and right side passengers on front seats. When a passenger sets a temperature in a compartment at a specific value, blowout air temperatures and air amounts are automatically and independently controlled at the left side and the right side of the compartment by the air conditioning system. Accordingly, the side on which sunlight is incident has a lowered temperature to automatically correct the effect by the intensity of solar radiation, thereby keeping the temperature in the compartment constant.

Figure 1:
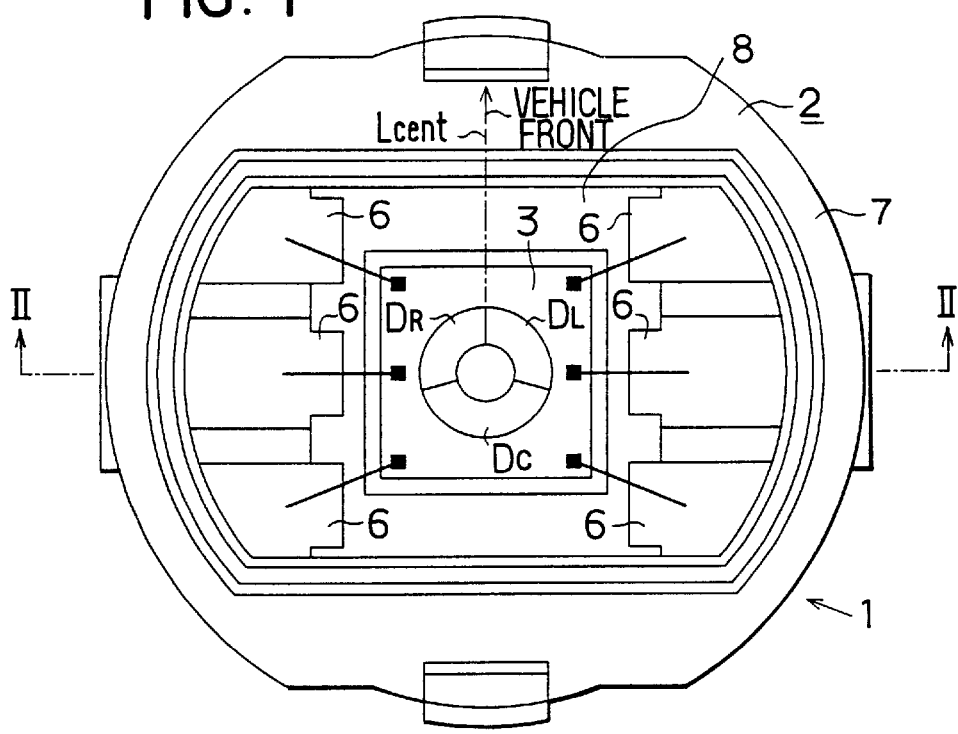
FIG. 1 is a plan view showing a sensor for detecting a quantity of light in a first preferred embodiment.
Figure 2:
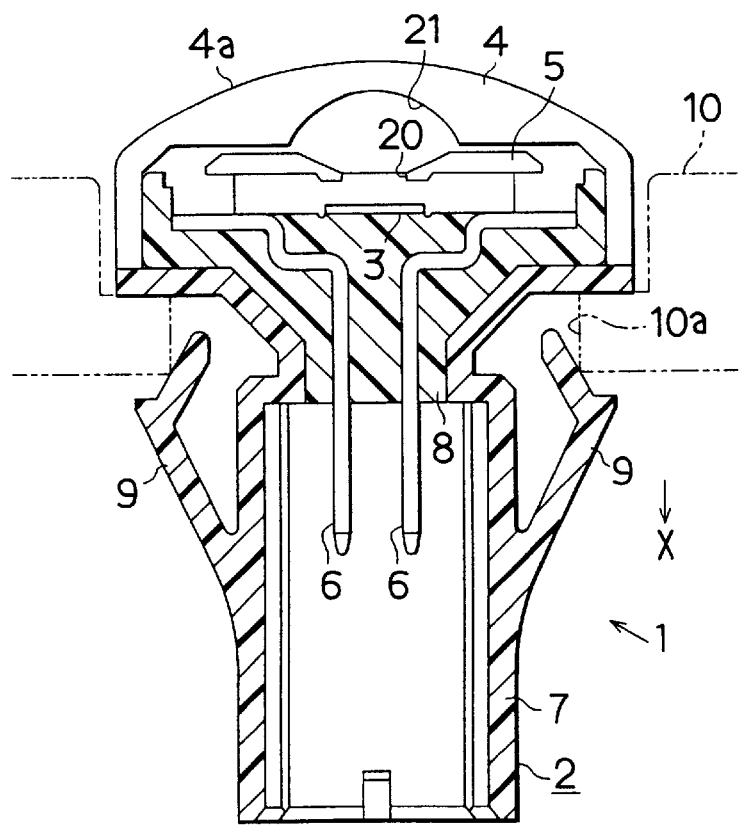
FIG. 2 is a cross-sectional view taken along line II—II in FIG. 1.

FIGS. 1 and 2 show the sensor in the first embodiment. FIG. 1 is a plan view showing a state where an optical lens 4 and a slit plate (shading plate) 5 shown in FIG. 2 are detached. Referring to FIG. 2, the sensor 1 has a sensor housing 2 capable of functioning as a connector, a sensor chip 3, the optical lens 4, the slit plate 5, and terminals 6. The sensor housing 2 is composed of a case 7 and a holder 8, which are made of synthetic resin. The case 7 is a cylinder and stands when used. The holder 8 is inserted into an upper portion of the case 7. Since the sensor housing 2 is composed of the case 7 and the holder 8, it is possible to exchange only the holder 8 (a connector portion and a photodetector mounting portion) to match a sensor specification using the case 7 as a common member.

Sensor attachment claws 9 are provided on the outer surface of the case 7. The sensor 1 is inserted into an attachment hole 10a of an instrument panel 10 of the vehicle in a direction X in FIG. 2, and is fixed therein by an urging force of the sensor attachment claws 9 applied outwardly.

The sensor chip 3 is disposed at the central portion of the upper surface of the holder 8. The terminals 6 are insert-molded with the holder 8 as output terminals to output sensor signals. The terminals are partially embedded in the holder 8. Each of the terminals 6 has an end exposed on the upper surface of the holder 8 and the other end protruding from the lower surface of the holder 8.

Figure 3:
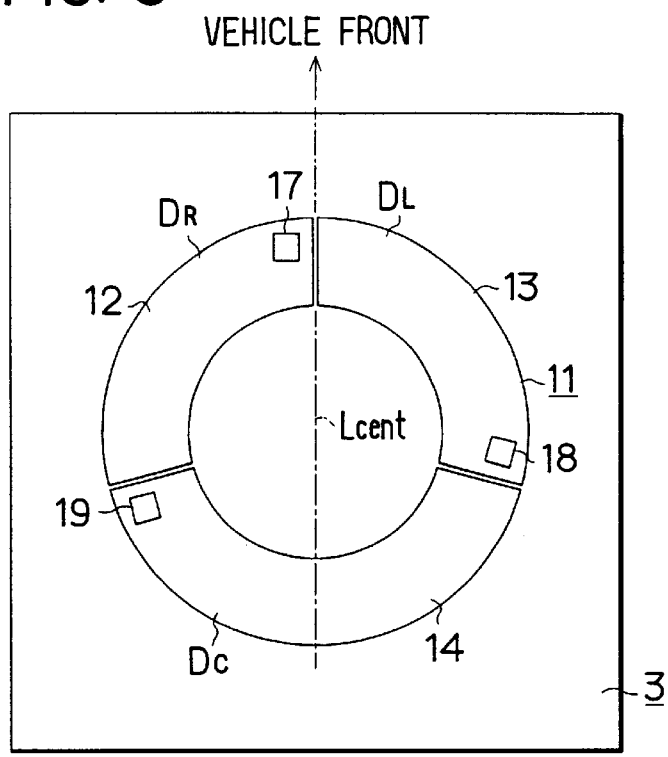
FIG. 3 is a plan view showing a sensor chip.

Referring to FIGS. 1 and 3, the rectangular sensor chip 3 has a right side photodetector $D_R$ disposed at a left side of an axis $L_{cent}$, a left side photodetector $D_L$ disposed at a right side of the axis $L_{cent}$, and a central photodetector $D_C$ disposed on the axis $L_{cent}$. The axis $L_{cen}$ is a reference of 0° azimuth. The photodetectors $D_R$, $D_L$, $D_C$ respectively output signals corresponding quantities of light incident thereon. Photodiodes are used as the photodetectors $D_R$, $D_L$, $D_C$.

Figure 4:
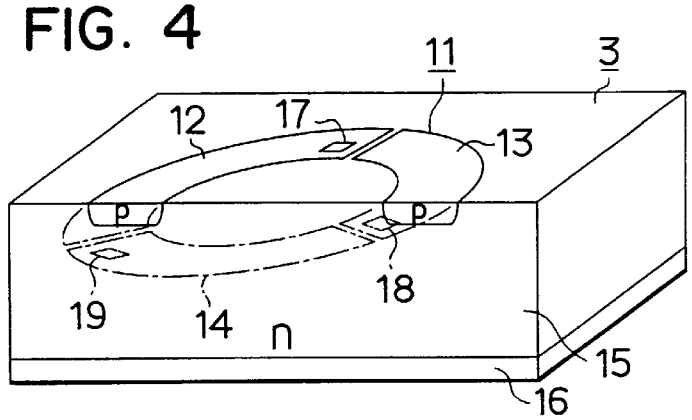
FIG. 4 is an explanatory view of the sensor chip.

The sensor chip 3 is more specifically explained with reference to FIGS. 3 and 4. The sensor chip 3 is a photo IC including the photodetectors $D_R$, $D_L$, $D_C$ and a signal processing circuit. The sensor chip 3 has an annular photo-detecting region 11, which is divided into photo-detecting regions 12, 13, 14 with an interior angle of approximately 120°. The regions 12, 13, 14 are electrically insulated from one another. More specifically, as shown in FIG. 4, p type regions 12, 13, 14 are formed in a surface portion of an n type silicon substrate 15. A cathode electrode 16 is formed on the back surface of the silicon substrate 15, and anode electrodes 17, 18, 19 are respectively formed on the p type regions 12, 13, 14 at the main surface side of the silicon substrate 15. The photodetectors $D_R$, $D_L$, $D_C$ are respectively formed in the p type regions 12, 13, 14, and output-electric signals (photoelectric current) corresponding to the quantities of light incident on the regions 12, 13, 14. In FIG. 3, the signal processing circuit is formed at the outer circumference side of the annular photo-detecting region 11.

Figure 5:
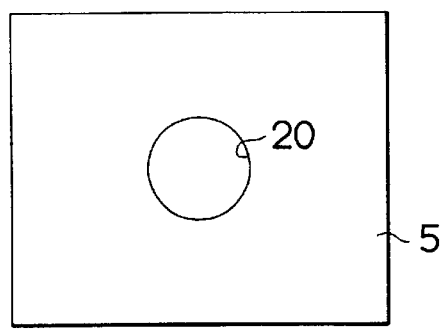
FIG. 5 is a plan view showing a slit plate.

Referring again to FIG. 2, the slit plate 5 as a shading member is supported on the upper surface of the holder 8 to cover the sensor chip 3. The slit plate 5 is specifically shown in FIG. 5. The slit plate 5 is made of a shading material, and has a circular slit (through hole) 20 as a light transmittance portion penetrating through the central portion thereof. The slit 20 of the slit plate 50 is positioned just above the sensor chip 3 so that the center of the slit 20 is disposed on the axis $L_{cent}$.

The optical lens 4 is made of colored glass or resin (translucent material), and has a cup-like shape. The optical lens 4 fits the outer circumference surface of the case 7, and is supported by the housing 2 to be disposed above the sensor chip 3. A recess 21 is formed at the central portion of the inner surface of the optical lens 4 to provide a lens function to the optical lens 4. The optical lens 4 may be composed of an aggregate lens (Fresnel lens) of prisms, or the like in stead of the concave lens to exhibit the lens function.

Light incident on the surface of the optical lens 4 in FIG. 2 passes through the optical lens 4 to be incident on the slit plate 5. Light passing through the slit 20 of the slit plate 5 then enters the photodetectors $D_R$, $D_L$, $D_C$ (see FIG. 1). Accordingly, electric signals are outputted from the photodetectors $D_R$, $D_L$, $D_C$. That is, light incident on the sensor surface (optical lens 4) progresses within the lens 4 while changing its optical path according to the reflective index and the shape of the lens 4 and is radiated onto the sensor chip 3. The radiated light reaches the sensor chip 3 after passing through the slit 20 of the slit plate 5. Since the optical lens 4 is concave at a side where light is radiated therefrom, light entering from a horizontal direction (with a sensor elevation of 0°) is also introduced to the sensor chip 3.

Figure 6:
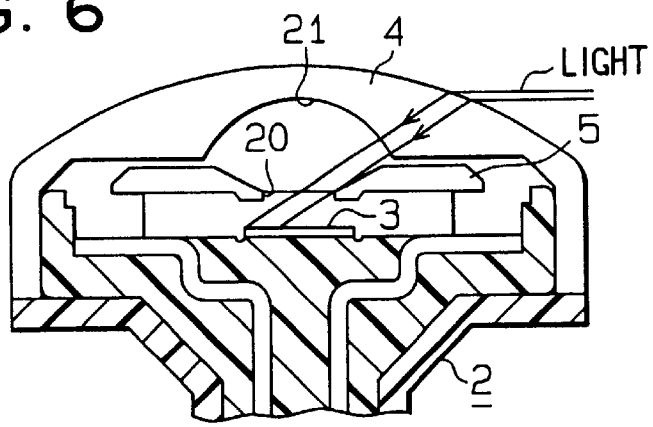
FIG. 6 is a cross-sectional view showing an optical path in the sensor.
Figure 7:
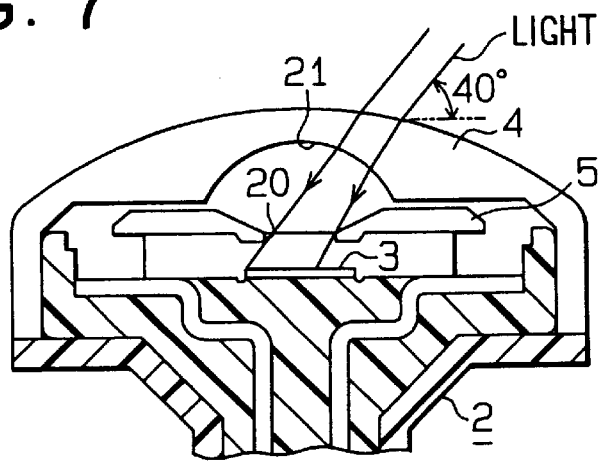
FIG. 7 is a cross-sectional view showing an optical path in the sensor.
Figure 8:
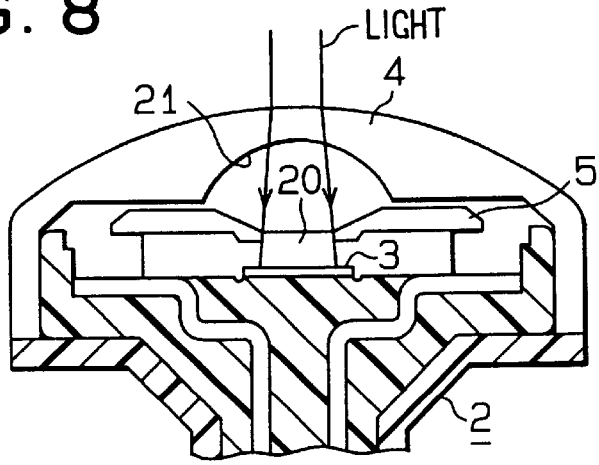
FIG. 8 is a cross-sectional view showing an optical path in the sensor.

That is, as shown in FIG. 6, an optical path of light with an elevation of 0° is changed by the optical lens 4 so that the light is introduced to the sensor chip 3 through the slit 20 of the slit plate 5. As shown in FIG. 7, an optical path of light with an elevation of 40° is also changed by the optical lens 4 so that the light is introduced to the sensor chip 3. Similarly, light with an elevation of 90° is introduced to the sensor chip 3 as shown in FIG. 8.

Figure 9:
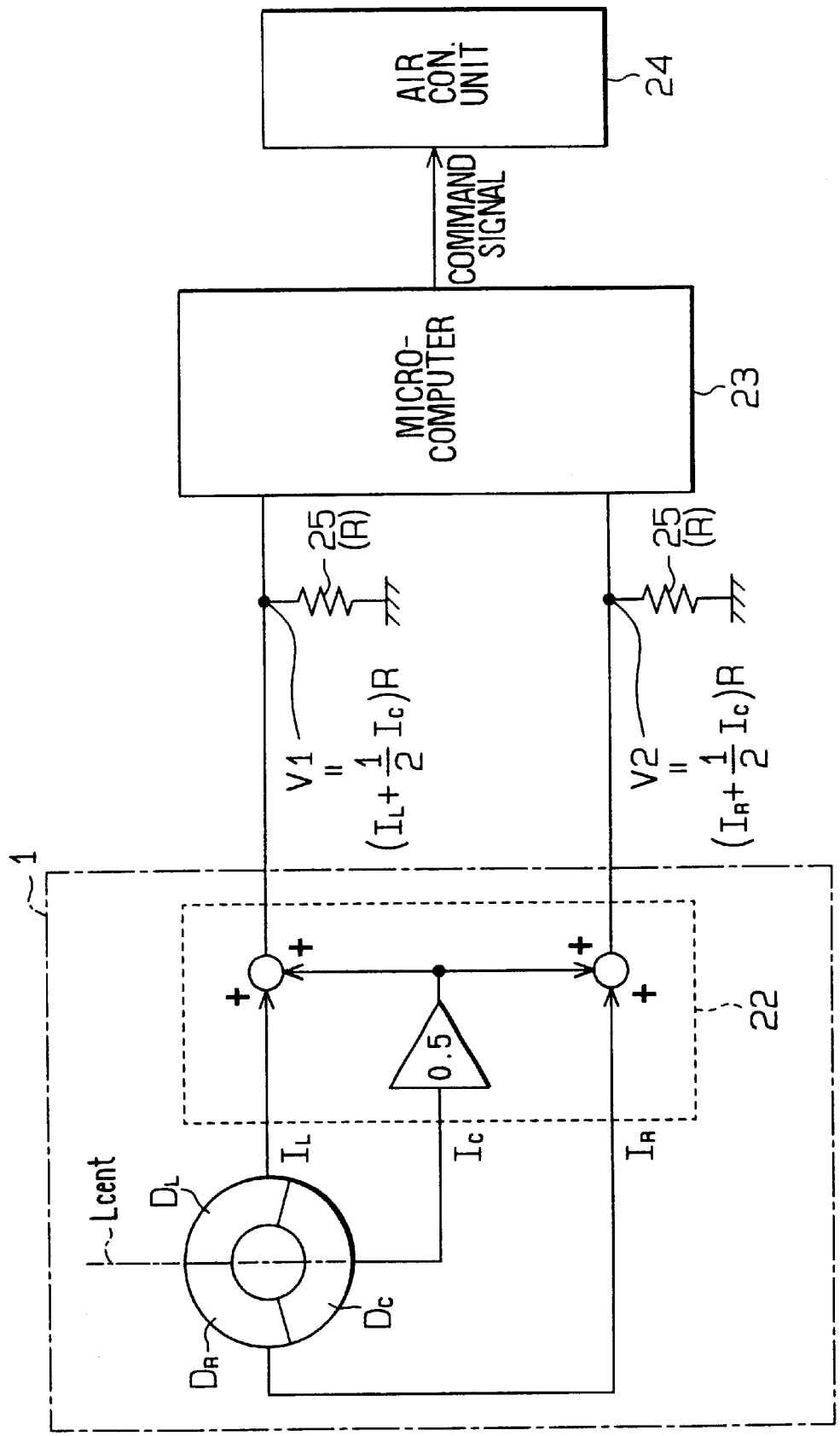
FIG. 9 is a diagram showing an electrical constitution of an automatic air conditioning system.

FIG. 9 shows an electric constitution of the automatic air conditioning system in the present embodiment. The signal processing circuit 22 is connected to the three photodetectors $D_R$, $D_L$, $D_C$. In the signal processing circuit 22, an output current from the left side photodetector $D_L$ and a half of an output current from the central photodetector $D_C$ are added as a left side light signal output current ($=I_L+\frac{1}{2}\cdot I_C$). The left side light signal output current is converted into a voltage by a resistor 25 whose value of resistance is R, and is transmitted to a microcomputer 23. An output current from the right side photodetector $D_R$ and a half of the output current from the central photodetector $D_C$ are added as a right side light signal output current ($=I_R+\frac{1}{2}\cdot I_C$). The right side light signal output current is also converted into a voltage by the resistor 25 of R in the value of resistance, and is transmitted to the microcomputer 23.

That is, an output voltage is determined by the left side output voltage V1 and the right side output voltage V2, which are represented by the following formulas:

$V1$=(left side photodetector output current+(central photodetector output current)/2)×$R$; and $V2$=(right side photodetector output current+(central photodetector output current)/2)×$R$.

Accordingly, the sum of the output voltages (=V1+V2) is constant without depending on the direction from which light enters to the photo-detecting regions 12, 13, 14.

Thus, the right side light signal is obtained by the output from the right side photodetector $D_R$ and the output from the central photodetector $D_C$ having small sensitivity. The left side light signal is obtained by the output from the left side photodetector $D_L$ and the output from the central photodetector $D_C$ having lowered sensitivity. The both signals cooperatively inform the intensity of solar radiation and the side where sunlight is incident on (driver's seat side or passenger's seat side). Specifically, the quantity of solar radiation is determined by the sum of the output signals (=V1+V2), and the direction in which sunlight enters is determined by an output ratio (=V1/(v1+V2) or V2/(V1+V2)).

The microcomputer 23 is connected to an air conditioning unit 24 including a blower, a cooler, a heater, and the like and mounted within the instrument panel of the vehicle. The microcomputer 23 inputs the two signals from the sensor 1, and controls the air conditioning unit 24 based on intensities of light incident on the left and right sides so that the side on which sunlight is incident (driver's seat side or passenger's seat side) receives an increased amount of air to have a lowered temperature.

Figure 10:
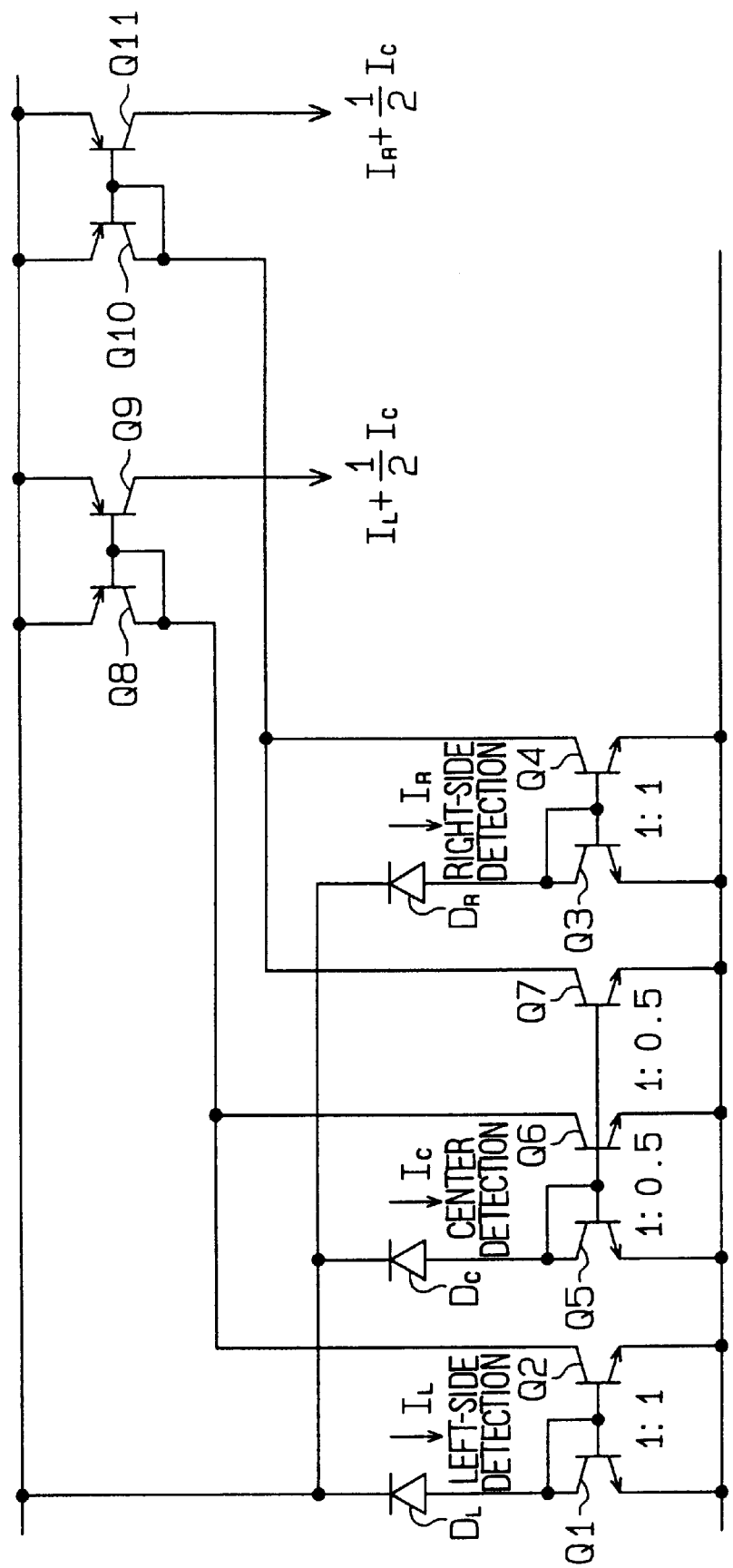
FIG. 10 is a diagram showing a constitution of a signal processing circuit.

FIG. 10 shows a constitution of the signal processing circuit 22 as an example. In the signal processing circuit 22, each of the photodetectors (diodes) $D_R$, $D_L$, $D_C$ has a current mirror circuit, and a current mirror ratio of the current mirror circuit is adjusted to perform a gain adjustment. The sensitivity of the central photodetector $D_C$ is lowered by controlling the gain of the signal outputted from the central photodetector $D_C$ to be smaller that those outputted from the other photodetectors $D_R$, $D_L$.

Specifically, a current mirror circuit composed of transistors Q1, Q2 is connected to the photodetector $D_L$. The transistor Q1 is connected to the photodetector $D_L$ in series. Likewise, a current mirror circuit composed of transistors Q3, Q4 is connected to the photodetector $D_R$, and a current mirror circuit composed of transistors Q5, Q6, Q7 is connected to the photodetector $D_C$.

Emitter areas of the transistors Q2, Q4, Q6, Q7 are controlled to control the current mirror ratios. Specifically, when the transistors Q2, Q4, Q6, Q7 are formed in the sensor chip 3, the emitter areas of the transistors Q6, Q7 are controlled to be different from the emitter areas of the transistors Q2, Q4. As a result, the gain of the current mirror circuit composed of the transistors Q1, Q2 is set at 1, the gain of the current mirror circuit composed of the transistors Q3, Q4 is set at 1, and the gain of the current mirror circuit composed of the transistors Q5, Q6, Q7 is set at 0.5. The sum of currents flowing in the transistors Q2, Q6 is amplified by a current mirror circuit composed of transistors Q8, Q9, and then is outputted. The sum of currents flowing in the transistors Q4, Q7 is amplified by a current mirror circuit composed of transistors Q10, Q11, and then is outputted.

Next, operation of the sensor 1 described above will be explained. As shown in FIGS. 6 to 8, light incident on the lens 4 is introduced to the photodetectors $D_R$, $D_L$, $D_C$ through the slit 20 of the slit plate 5. Each of the photodetectors $D_R$, $D_L$, $D_C$ receives light and respectively convert it into signals corresponding to the quantity of light incident thereon. Further, in the signal processing circuit 22 shown in FIG. 9, the left side light signal V1 is obtained by the output from the left side photodetector $D_L$ and the output from the central photodetector $D_C$ having small sensitivity. The right side light signal V2 is obtained by the output from the right side photodetector $D_R$ and the output from the central photodetector $D_C$. The microcomputer 23 detects the quantity and the direction of solar radiation to perform the left side and right side independent controls of the air conditioner, i.e., to independently air-condition the right and left seats based on the detected quantity of light.

Figure 11:
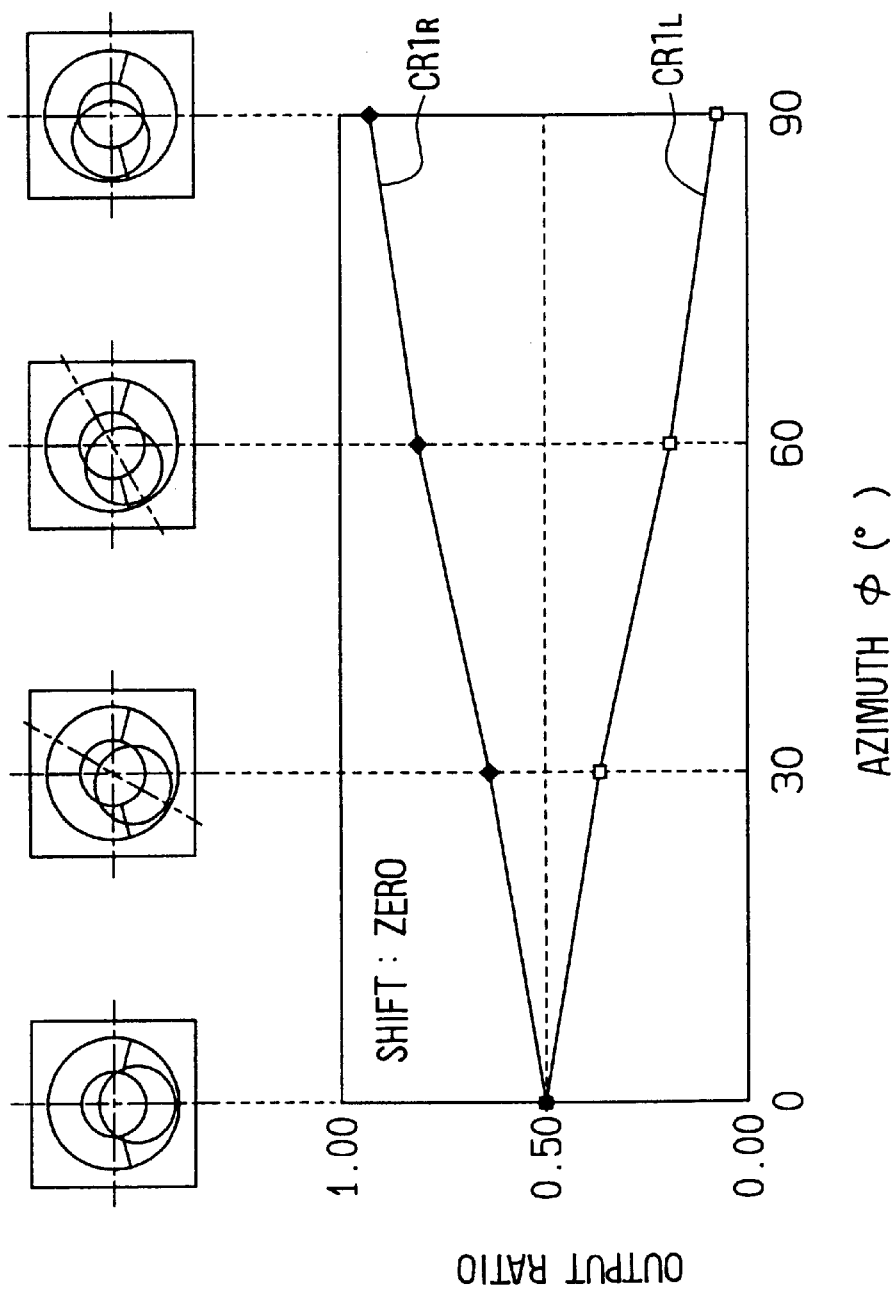
FIG. 11 is a graph showing a relationship between the azimuth and output ratios of the sensor with no positional shift.
Figures 12A, 12B, 12C, 12D:
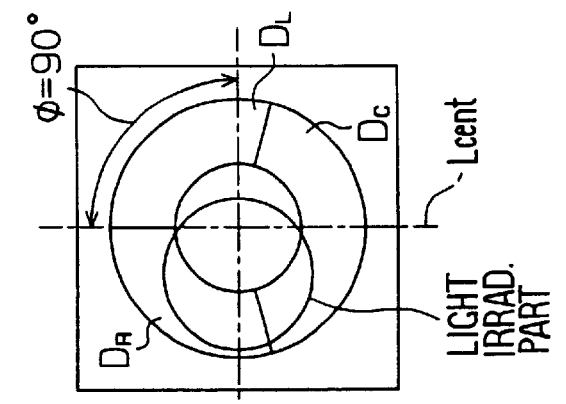
FIGS. 12A to 12D are schematic views showing light irradiated parts when the azimuth is changed.

Next, characteristics of the sensor 1 when the silt 20 of the slit plate 5 is offset from the axis $L_{cent}$ to cause a positional shift between the slit plate 5 and the photodetectors $D_R$, $D_L$, $D_C$ will be explained. FIG. 11 shows a relationship between azimuth Ø and right side and left side output ratios $CR1_R$, $CR1_L$ when there is no positional shift between the slit plate 5 and the photodetectors $D_R$, $D_L$, $D_C$. The light irradiated parts in cases where azimuth Ø is 0°, 30°, 60°, 90° are shown in FIGS. 12A to 12D, and the output ratios $CR1_R$, $CR1_L$ are shown in FIG. 11. The right side and left side output ratios $CR1_R$, $CR1_L$ in the present embodiment are represented by the following formulas:

$$CR1_R = ((C_R + 0.5 \cdot C_C) \times R) / ((C_R + C_L + C_C) \times R) = V2/(V1+V2)$$

$$CR1_L = ((C_L + 0.5 \cdot C_C) \times R) / ((C_R + C_L + C_C) \times R) = V1/(V1+V2)$$

Here, $C_R$ is an output current from the right side photodetector $D_R$, $C_L$ is an output current from the left side photodetector $D_L$, and $C_C$ is an output current from the central photodetector $D_C$. When azimuth Ø is 0°, the output ratios $CR1_R$, $CR1_L$ are 0.50, respectively.

Figure 13:
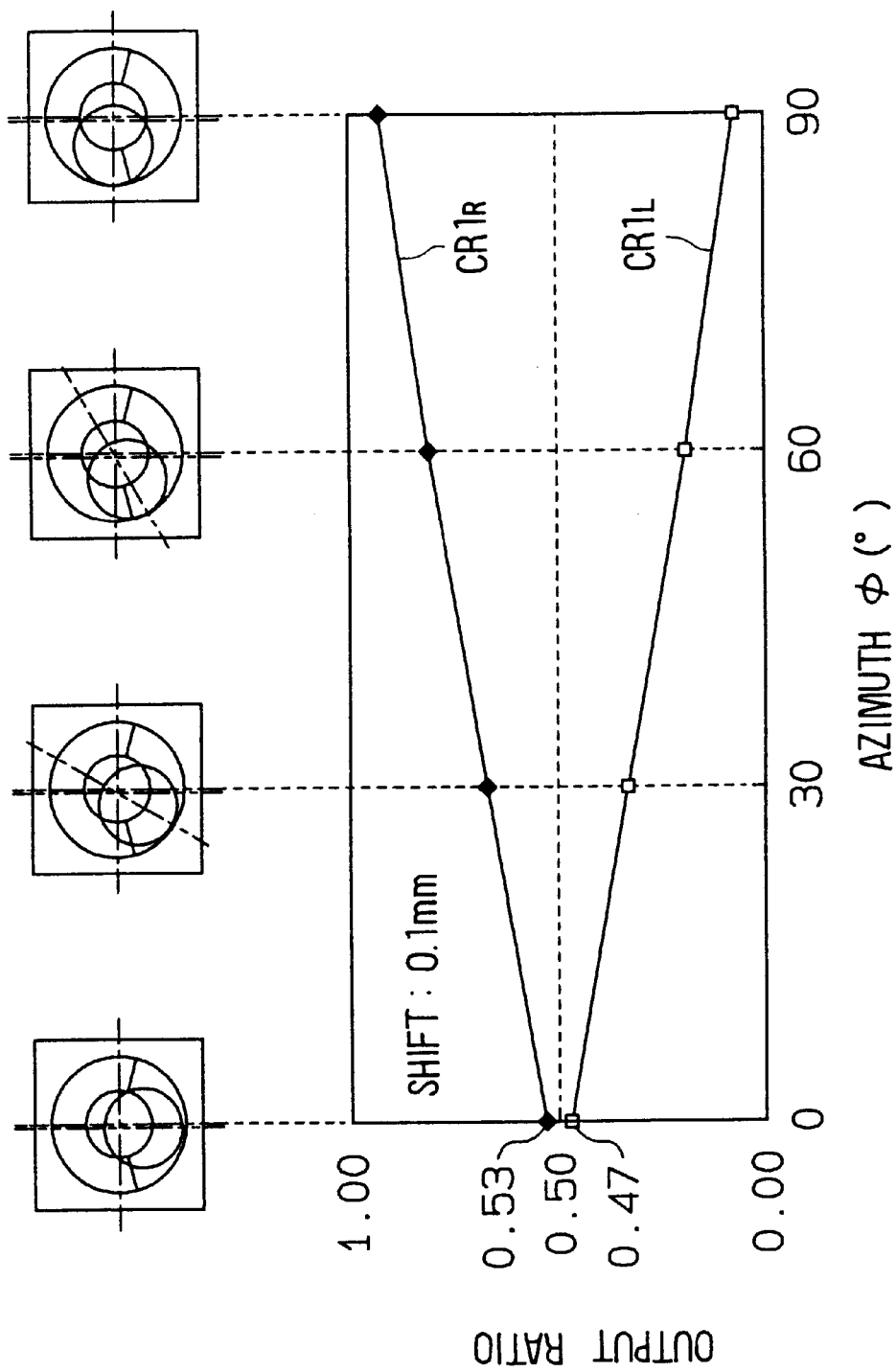
FIG. 13 is a graph showing a relationship between the azimuth and output ratios of the sensor with a positional shift.
Figure 14A:
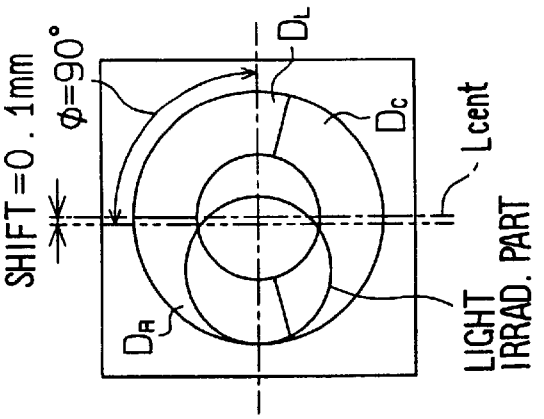
FIGS. 14A to 14D are schematic views showing light irradiated parts when the azimuth is changed.
Figure 14B:
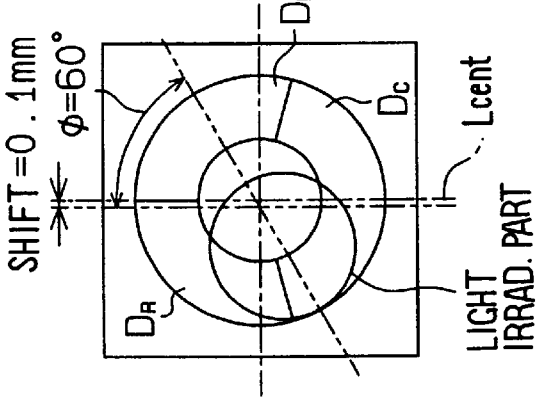
Figure 14C:
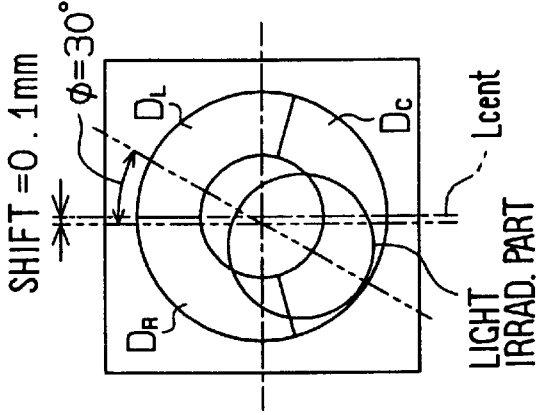
Figure 14D:
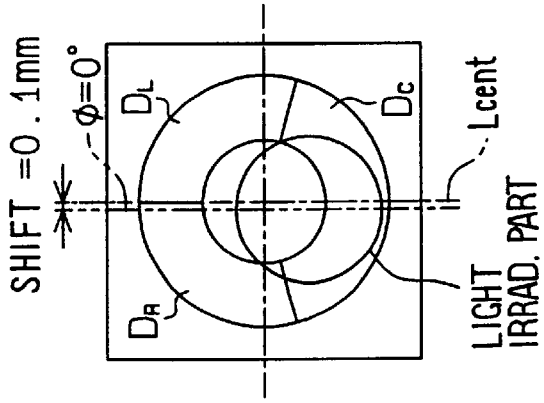
Figure 25:
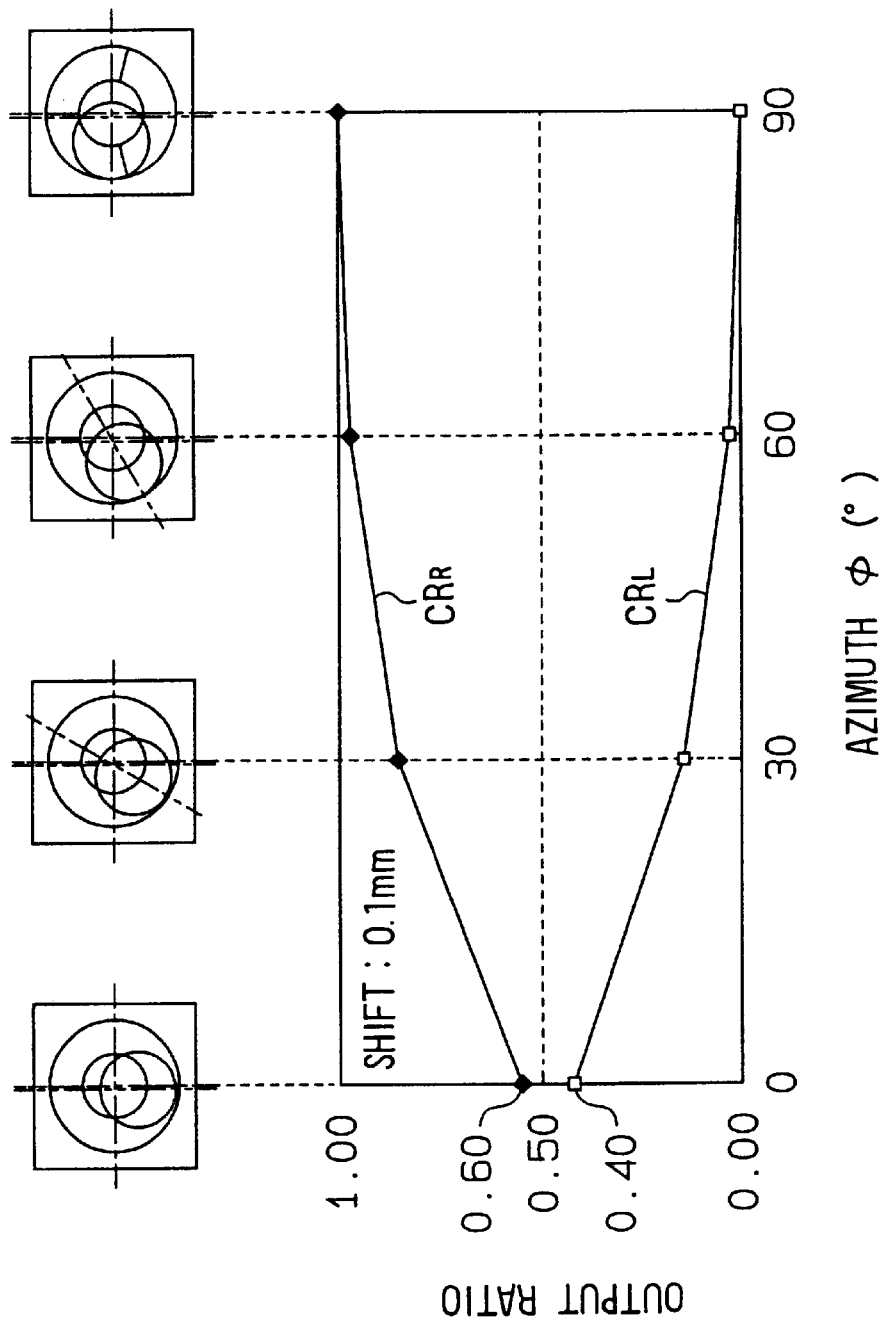
FIG. 25 is a graph showing a relationship between the azimuth and output ratios of the sensor with a positional shift.
Figure 26A:
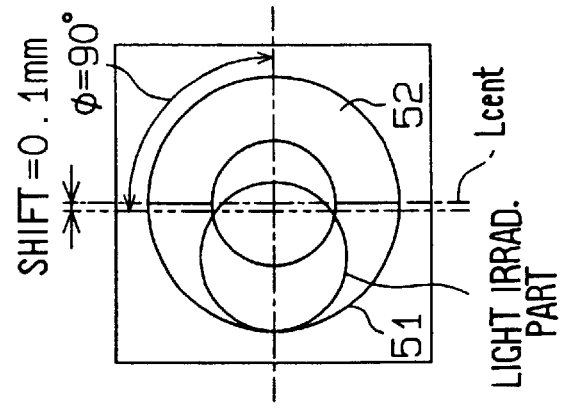
FIGS. 26A to 26D are schematic views showing light irradiated parts when the azimuth is changed.
Figure 26B:
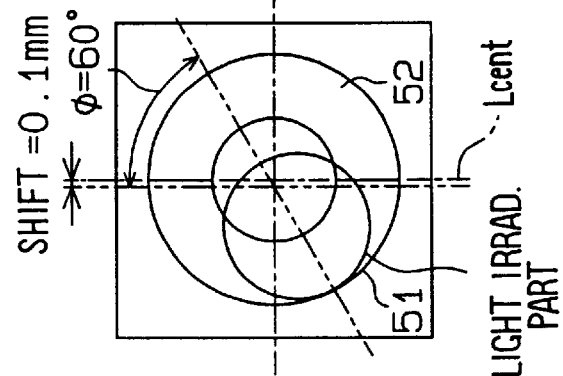
Figure 26C:
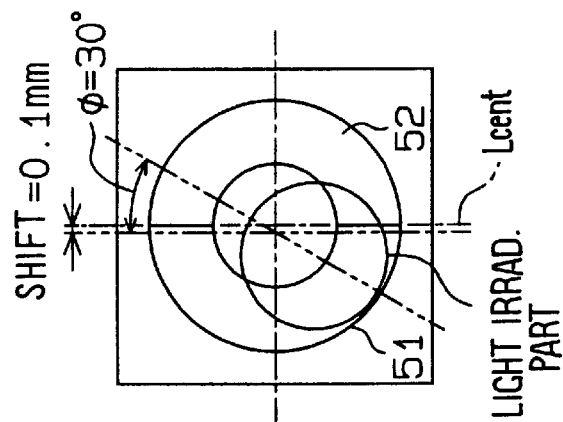
Figure 26D:
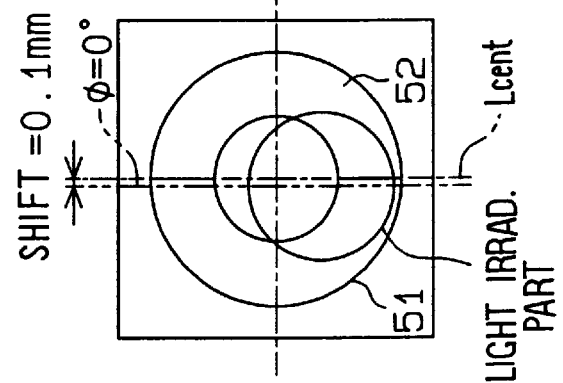
Figure 27:
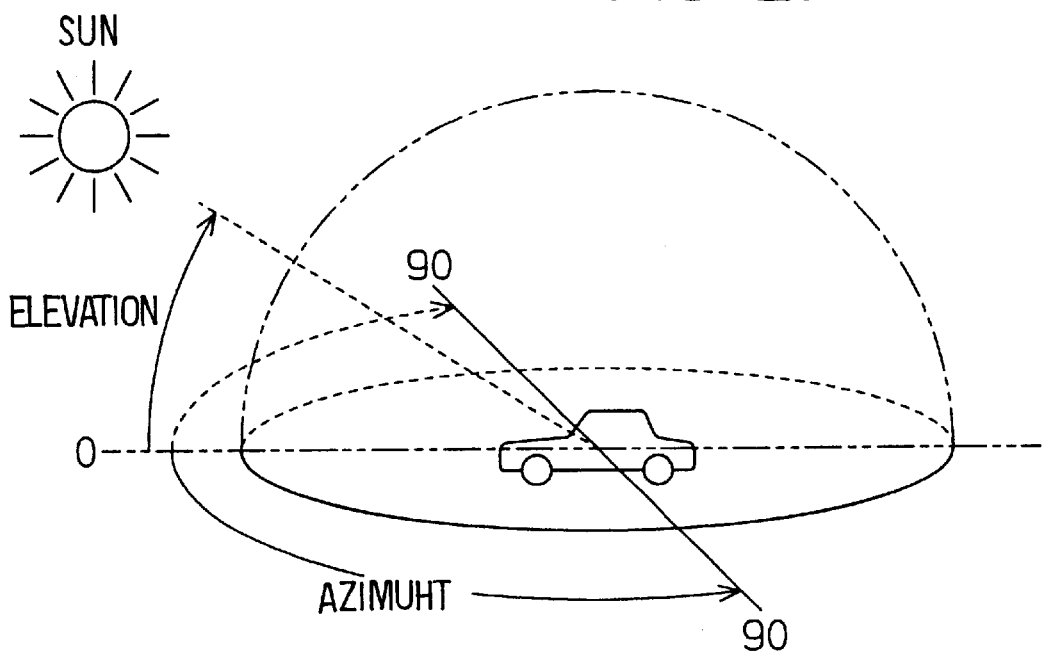
FIG. 27 is a schematic view for explaining the azimuth and the elevation.
Figure 28:
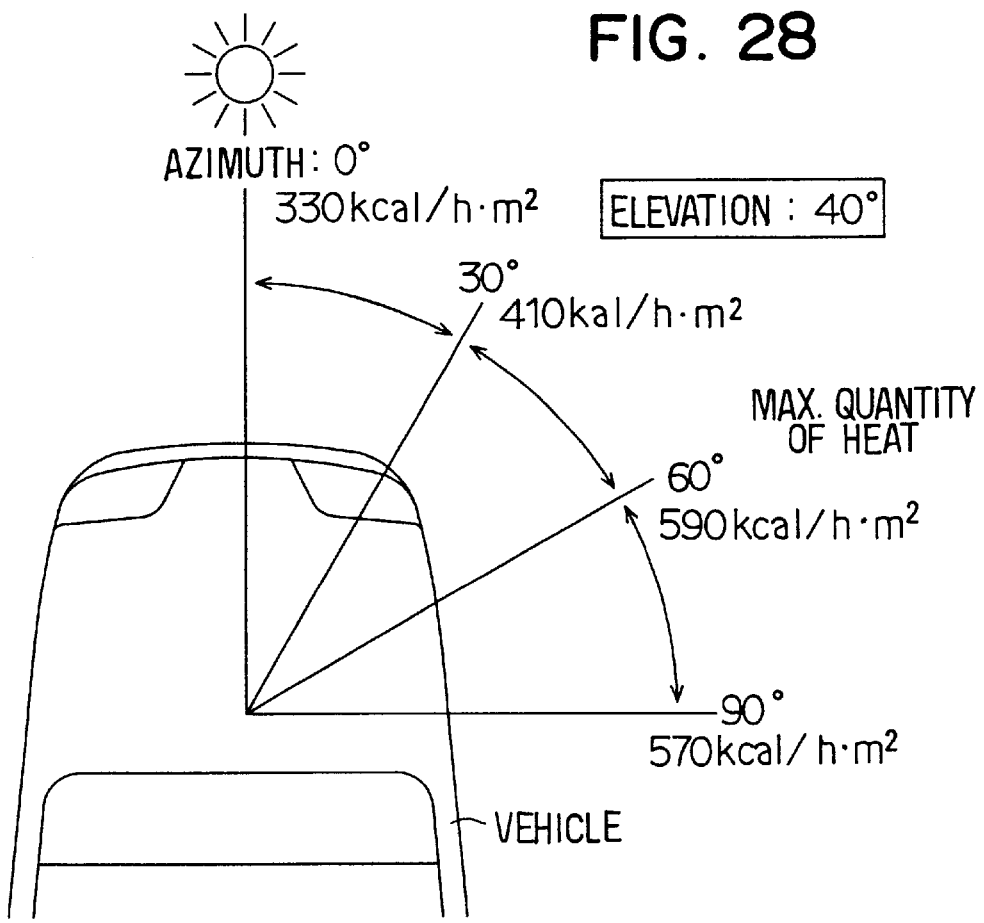
FIG. 28 is a schematic view for explaining a relationship between the azimuth and a quantity of heat.

On the other hand, FIG. 13 shows a relationship between azimuth Ø and right side and left side output ratios $CR1_R$, $CR1_L$ when there arises a positional shift between the slit plate 5 and the photodetectors $D_R$, $D_L$, $D_C$. The light irradiated parts in cases where azimuth Ø is 0°, 30°, 60°, 90° with a positional shift of 0.1 mm are shown in FIGS. 14A to 14D, and the output ratios $CR1_R$, $CR1_L$ in those cases are shown in FIG. 13. When azimuth Ø is 0°, the right side and left side output ratios $CR1_R$, $CR1_L$ are 0.53 and 0.47, respectively. The right side and left side output ratios $CR_R$, $CR_L$ of the sensor shown in FIG. 22 with the same shift (=0.1 mm) were, as shown in FIG. 25, 0.60 and 0.40, respectively when azimuth Ø was 0°. Accordingly, it is confirmed that the difference between the right side and left sideoutput ratios $CR1_R$, $CR1_L$ is decreased when azimuth Ø is 0° and when there is a positional shift between the slit plate 5 and the photodetectors $D_R$, $D_L$, $D_C$.

Figure 23:
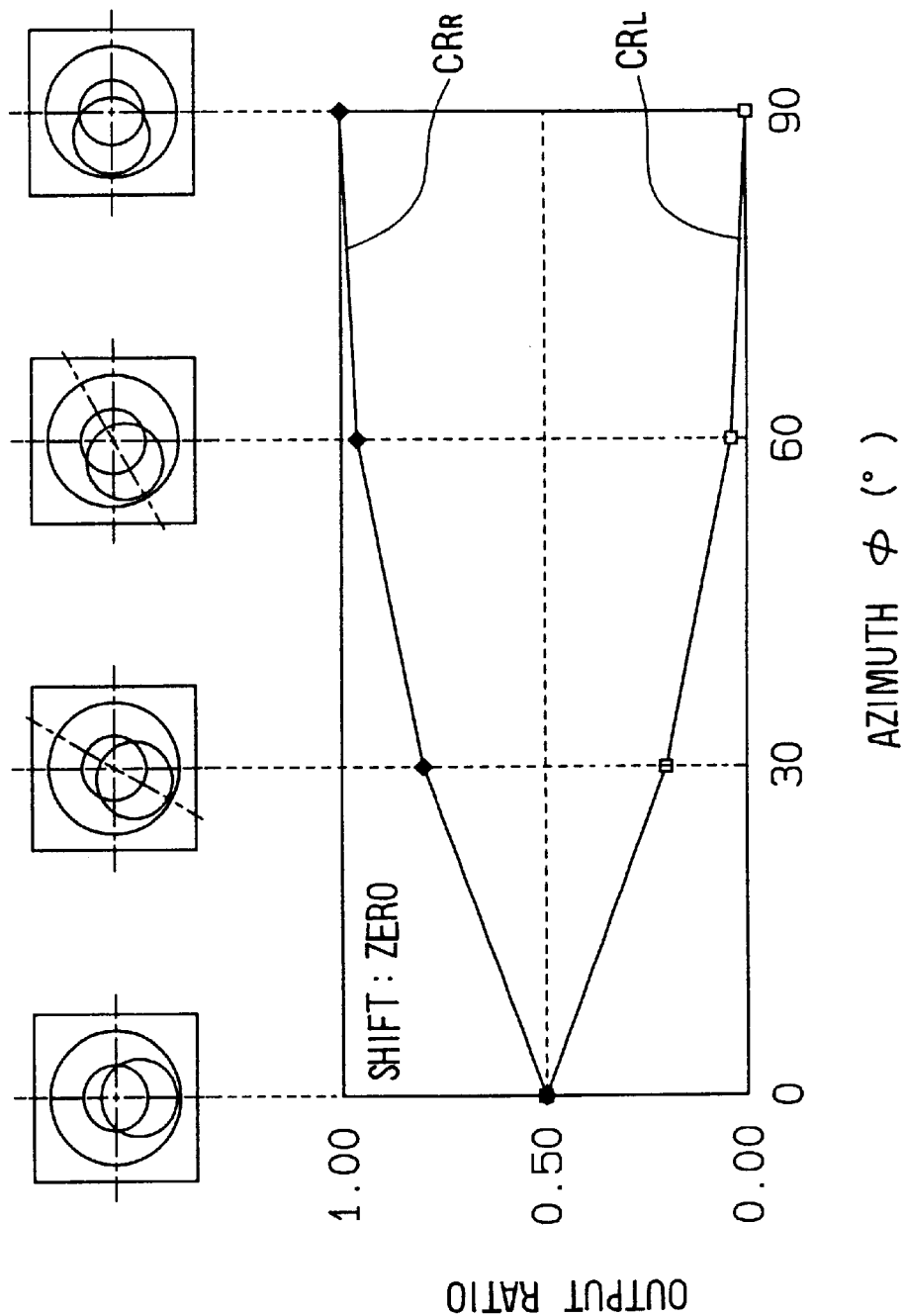
FIG. 23 is a graph showing a relationship between the azimuth and output ratios of the sensor with no positional shift in the related art.
Figure 24:
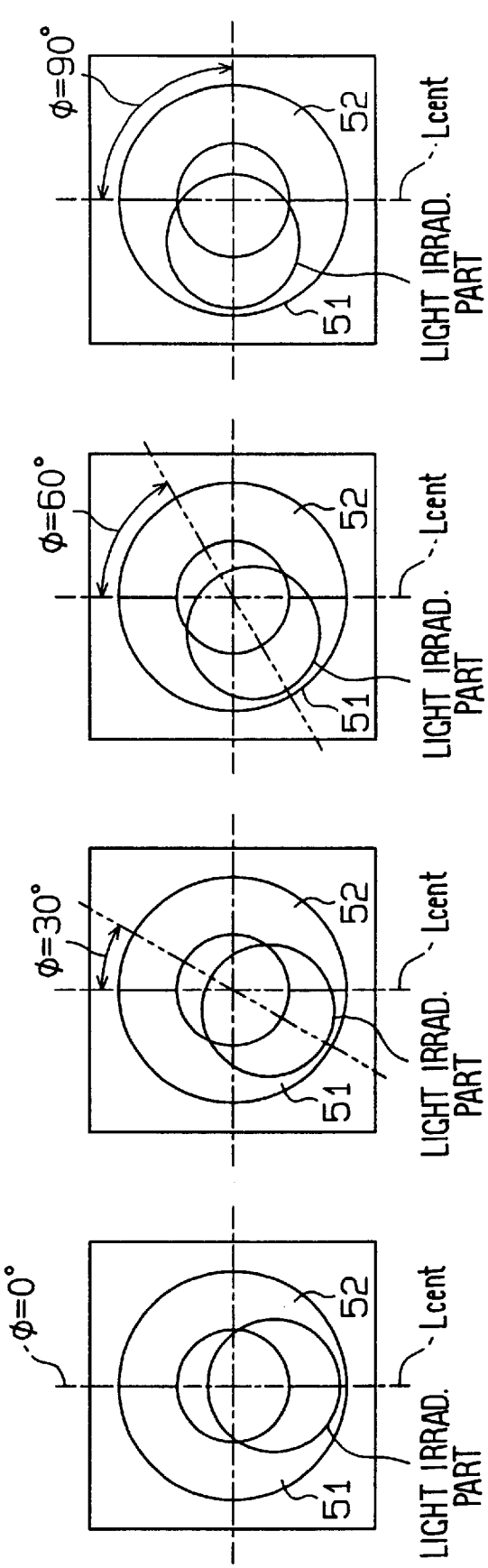
FIGS. 24A to 24D are schematic views showing light irradiated parts when the azimuth is changed.

Comparing FIGS. 11 and 23, the characteristics shown in FIG. 11 change with respect to a change in azimuth more linearly than those in FIG. 23. The reason is considered as follows. In the case shown in FIG. 23, the right side light signal is obtained only by the output from the right side photodetector $D_R$, and the left side light signal is obtained only by the output from the left side photodetector $D_L$. On the other hand, in the present embodiment shown in FIG. 11, sensitivities of the right side and left side light signals are depressed at a portion adjacent to the axis $L_{cent}$ (around 0° azimuth) by the output from the central photodetector $D_C$, sensitivity of which is lowered. Correctly, the sensitivities of the right side and left side light signals are depressed most when the azimuth is 0°, and the degree of depression decreases as the azimuth is increased.

Thus, the central photodetector (common detecting element) $D_C$ makes it difficult to produce the difference between the right side and left side light signals at the central detecting part (having an azimuth in a range of approximately 0° to ±30°). As a result, the effect by the assembling shift (offset from the center) is moderated. The sensor characteristics are not liable to be affected by the positional shift between the slit plate 5 and the photodetectors $D_R$, $D_L$, $D_C$, resulting in high accuracy for independently air-conditioning the left side and right side in the compartment.

Figure 29:
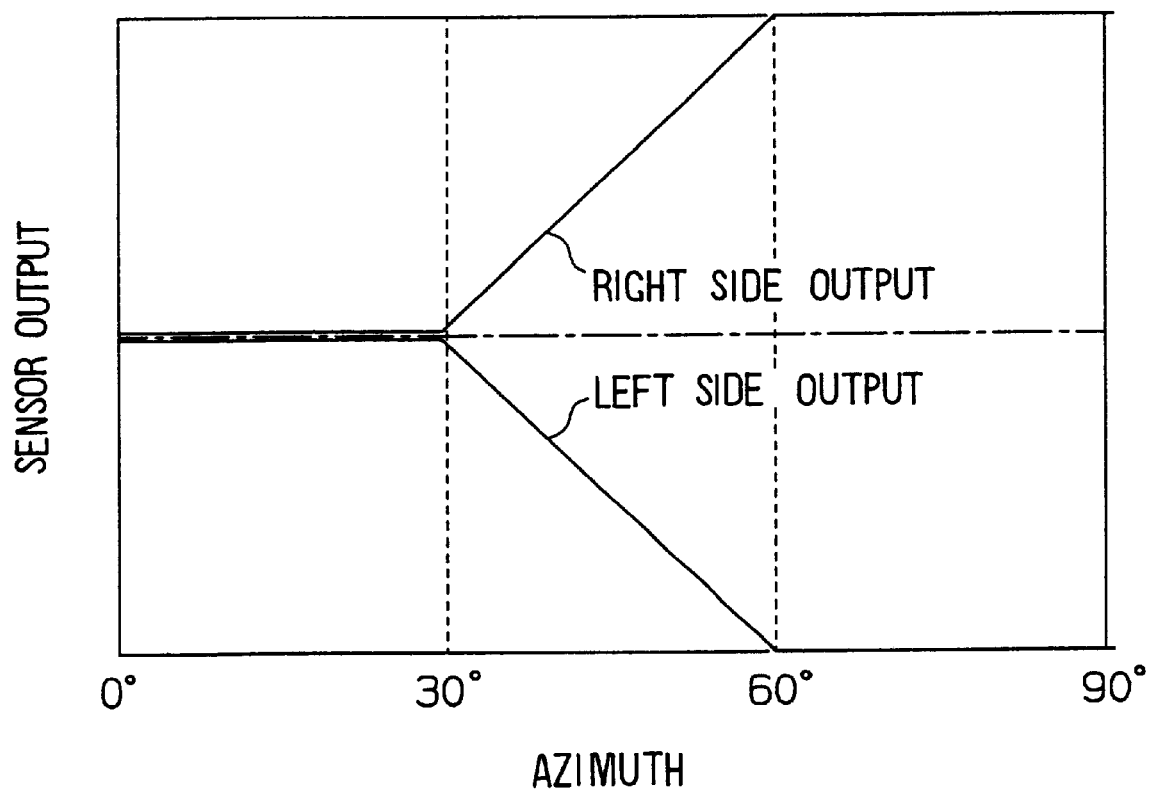
FIG. 29 is a graph showing a sensor output with respect to the azimuth.

The detection characteristics can be approached to the ideal state shown in FIG. 29 by providing the central photodetector (common detecting element) $D_C$. That is, when the azimuth is small, light is incident on the portion adjacent to the reference axis $L_{cent}$. In this case, as shown in FIG. 11, the difference between the left side and right side light signals is small. When the azimuth becomes large to some extent, the difference between the light signals becomes also large. This makes it possible to approach the detection characteristics to the ideal state as compared to the case shown in FIG. 23.

Second Embodiment

A second preferred embodiment will be explained focusing on differences from the first embodiment.

Figure 15:
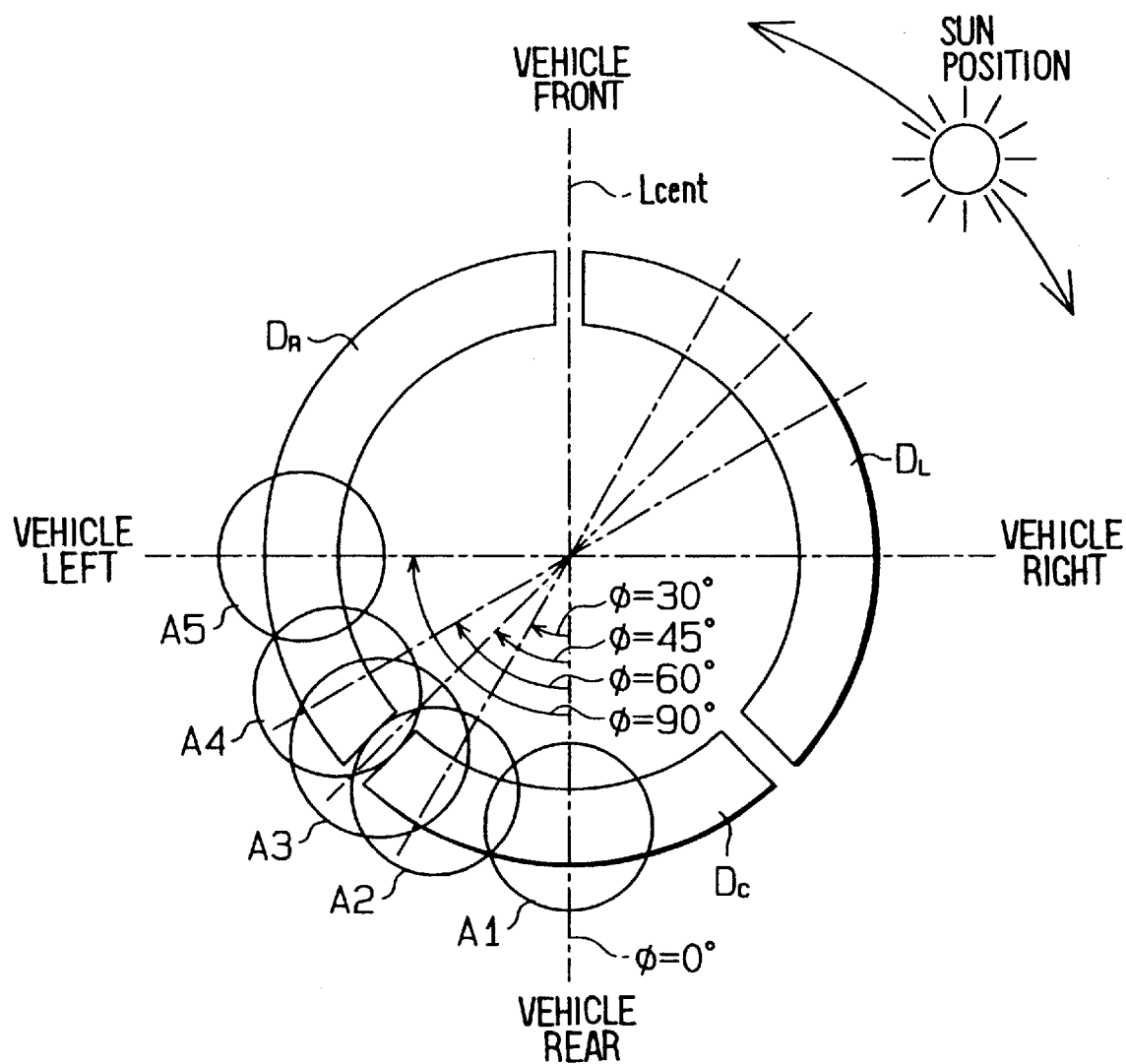
FIG. 15 is a plan view showing an arrangement of photodetectors and light irradiated parts with azimuths different from one another in a second preferred embodiment.
Figure 16:
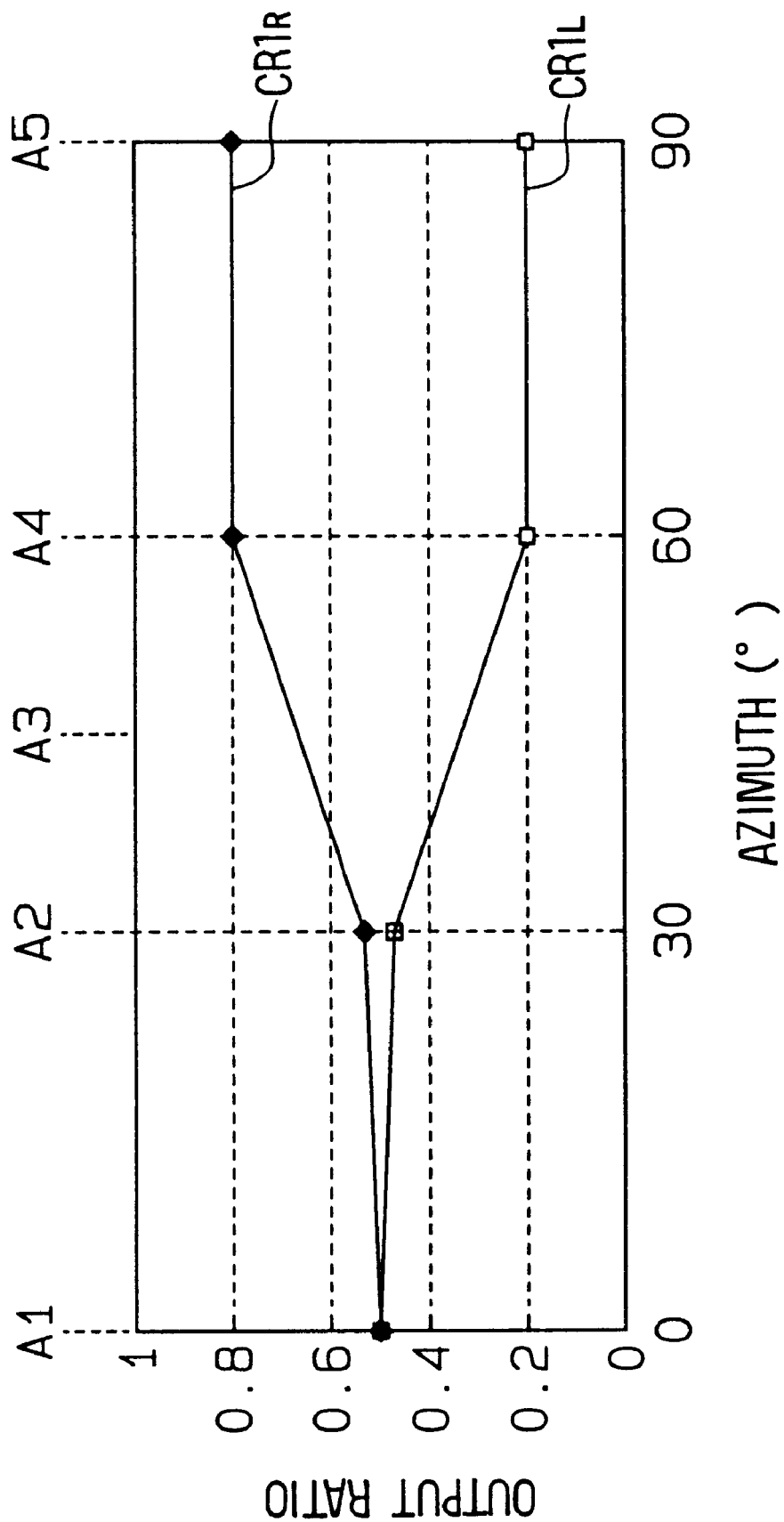
FIG. 16 is a graph showing a relationship between the azimuth and output ratios of a sensor in the second embodiment.
Figure 17:
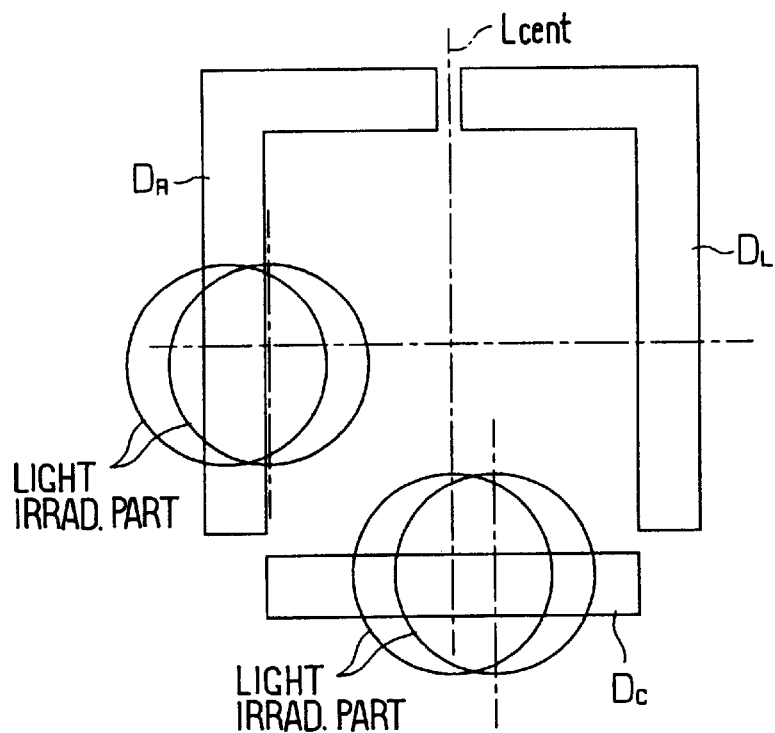
FIG. 17 is a plan view showing another arrangement of photodetectors.
Figure 18:
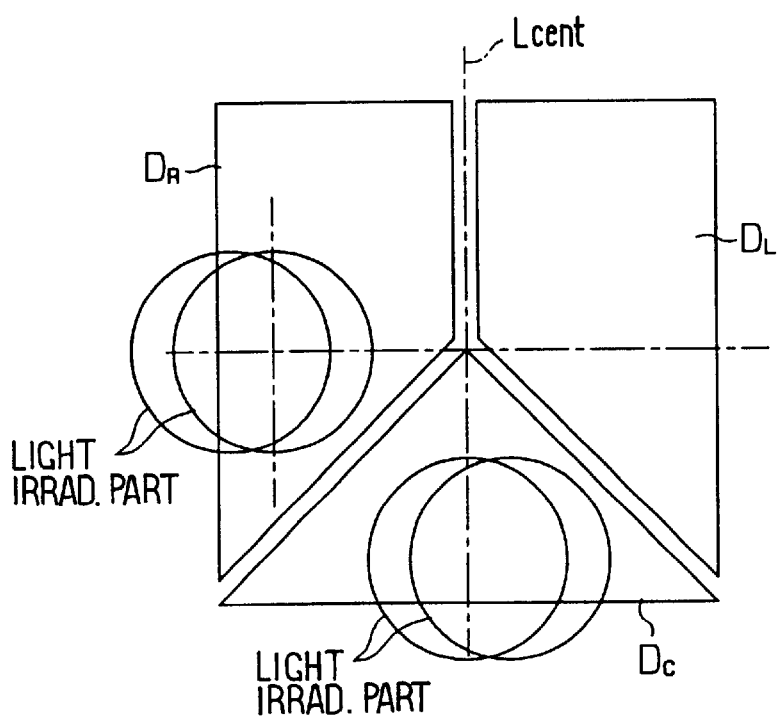
FIG. 18 is a plan view showing another arrangement of photodetectors.

As shown in FIG. 15, an area of each light irradiated part A1 to A5 is reduced with respect to the photodetectors by reducing the diameter of the slit 20 of the slit plate 5. Accordingly, in a relationship between azimuth and output ratios shown in FIG. 16, changes in output ratios are decreased when the azimuth is in a range of 0° to 30°, thereby approaching the ideal state more than that shown in FIG. 11. The intensity of light incident on the light irradiated part indicated with A4 when the azimuth is 60° is assumed to be maximum for the photodetectors $D_R$, $D_L$, and the area of the light irradiated part is not increased to A5 when the azimuth is 90°. The photodetectors $D_R$, $D_L$, $D_C$ are arranged into an annular shape; however, they may be arranged into other shapes such as a rectangle as shown in FIG. 17, or may be arranged entirely on the sensor chip 3 as shown in FIG. 18.

Third Embodiment

A third preferred embodiment will be explained focusing on differences from the first and second embodiments.

Figure 19:
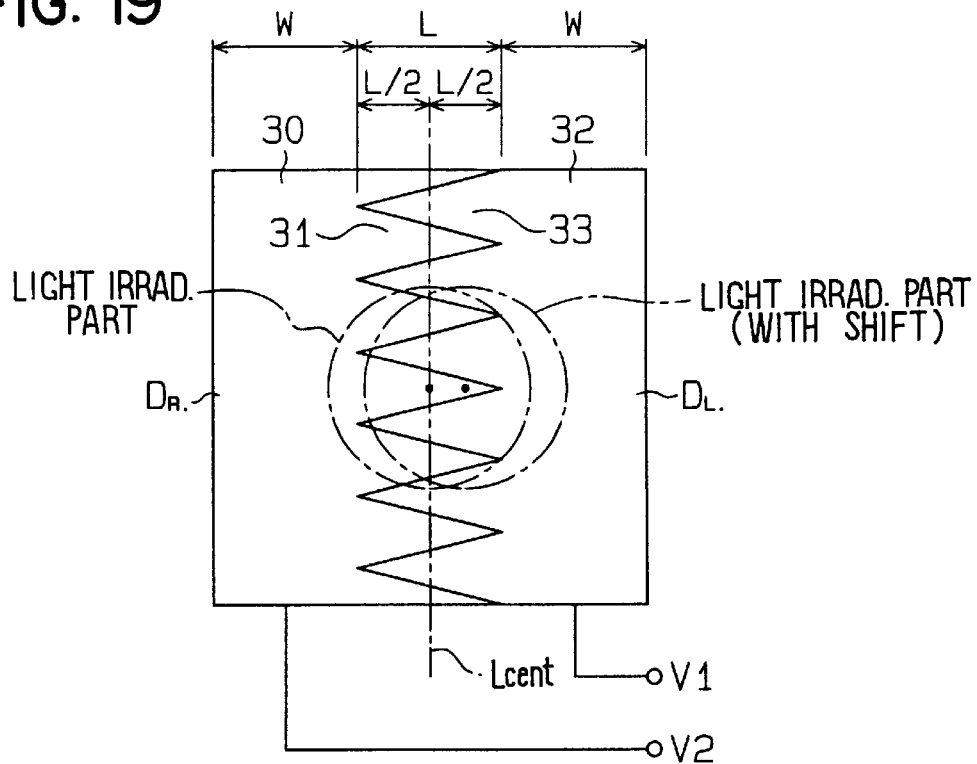
FIG. 19 is a plan view showing an arrangement of photodetectors in a third preferred embodiment.

As shown in FIG. 19, the right side and left side photodetectors $D_R$, $D_L$ are respectively disposed on the left and right sides of the axis $L_{cent}$, which is a reference when the azimuth is 0°. The left side and right side photodetectors $D_R$, $D_L$ are alternately disposed at a specific portion, a half width of which is L/2 from the axis $L_{cent}$. Specifically, the right side photodetector $D_R$ has a rectangular part 30 with a width W, and the right side surface of the rectangular part 30 is formed into a saw-tooth shape having several isosceles triangle teeth 31. Likewise, the left side photodetector $D_L$ has a rectangular part 32 with a width W, and the left side surface of the rectangular 32 is formed into a saw-tooth shape having several isosceles triangle teeth 33. The saw-tooth part of the right side photodetector $D_R$ and the saw-tooth part of the left side photodetector $D_L$ are disposed on the axis $L_{CENT}$ to fit each other.

The sensor described above is operated to detect a quantity of light as follows.

As shown in FIG. 7, light enters the photodetectors $D_L$, $D_R$ shown in FIG. 19 after passing through the slit 20 of the slit plate 5. The left side and right side photodetectors $D_L$, $D_R$ then convert light incident thereon into signals corresponding to quantities of the light. The right side light signal is obtained by the output from the right side photodetector $D_R$, and the left side light signal is obtained by the output from the left side photodetector $D_L$. In the microcomputer 23 shown in FIG. 9, the quantity of solar radiation is determined by the sum of the right side and left side light signals, and the direction (right side or left side) of sunlight is determined by the output ratio between both signals. Then, the microcomputer 23 controls the air conditioning unit 24 (see FIG. 9) to independently air-conditioning right and left seats in the compartment.

Figure 22:
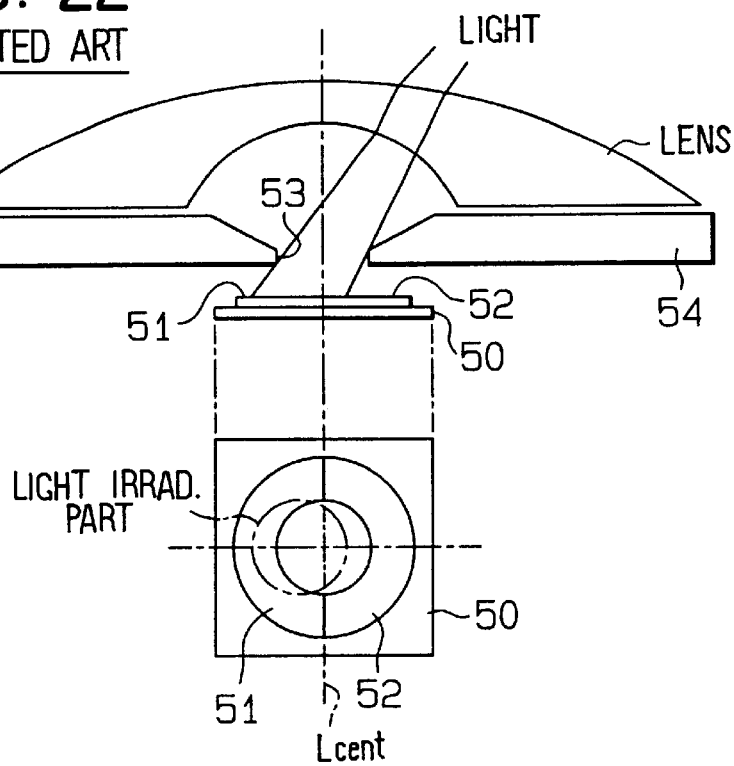
FIG. 22 is an explanatory view showing a sensor in a related art.

At that time, there may arise a positional shift between the slit plate 5 and the photodetectors $D_L$, $D_R$. That is, the center of the slit 20 of the slit plate 5 may be offset from the axis $L_{CENT}$. Even in such a case, the right side and left side light signals in the present embodiment are less susceptible to the positional shift as compared to the case where the left side and right side photodetectors $D_L$, $D_R$ are divided by the axis $L_{CENT}$ as shown in FIG. 22. This is because the saw-tooth parts of the left side and right side photodetectors $D_L$, $D_R$ are alternately disposed along the axis $L_{CENT}$ with a specific width L to blunt the sensitivity along the axis $L_{CENT}$. When the positional shift is not considered, light is incident on the vicinity of the axis $L_{CENT}$ with a small azimuth. In this case, the difference between both light signals is small. As the azimuth is increased, the difference between both light signals is also increased, thereby approaching the ideal detection characteristics shown in FIG. 29.

Fourth Embodiment

Figure 20:
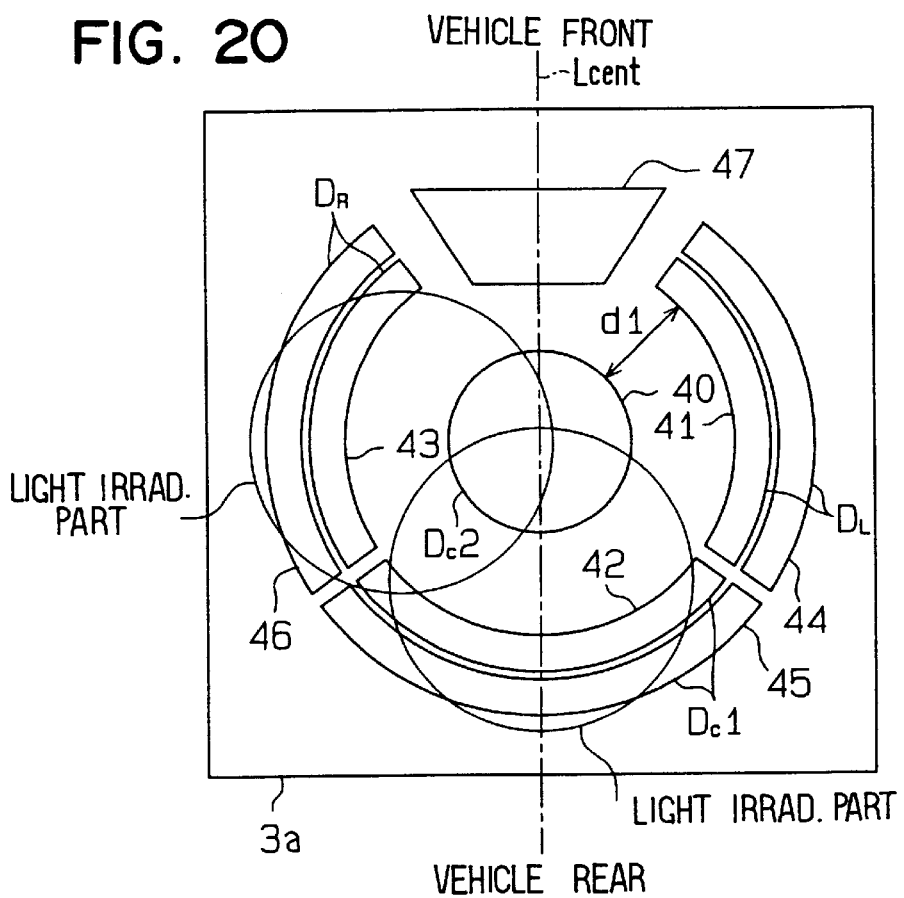
FIG. 20 is a plan view showing a sunlight sensor in a fourth preferred embodiment.
Figure 21:
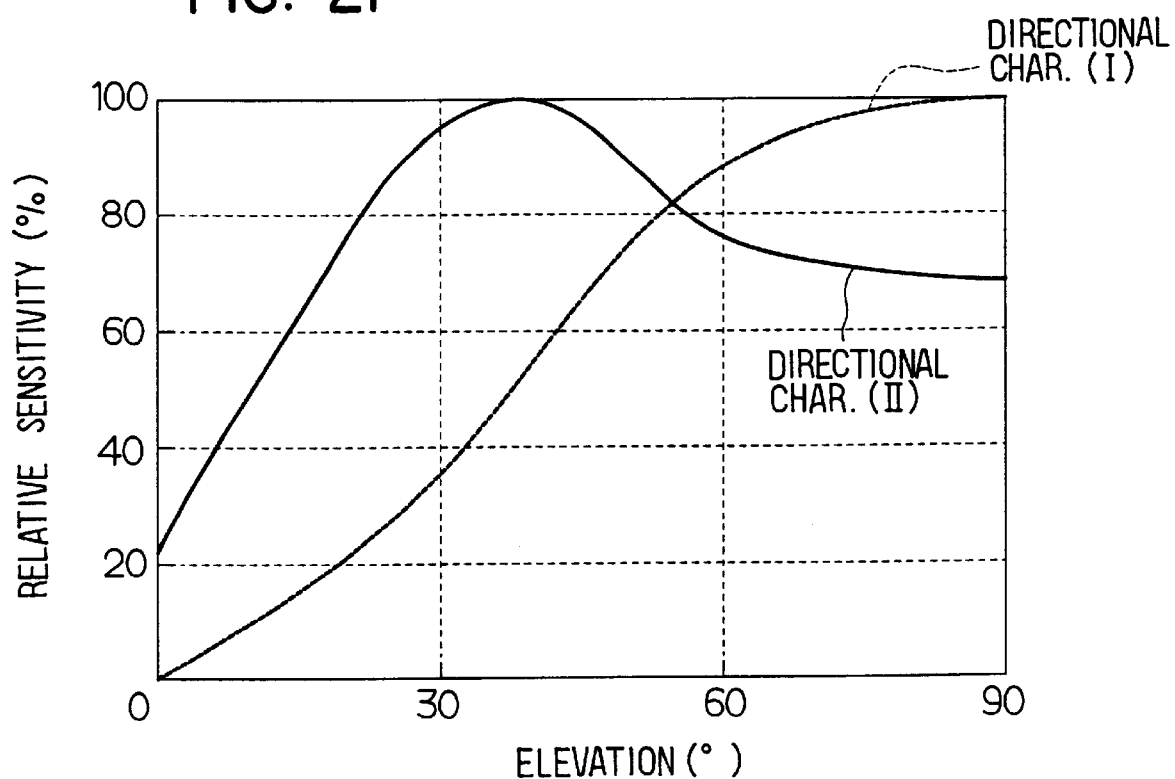
FIG. 21 is a graph showing relative sensitivities with respect to an elevation.

Next, a fourth preferred embodiment will be explained focusing on differences from the first and second embodiments. FIG. 20 shows a sensor (sensor chip) 3a in the present embodiment. The sensor 3a is mounted on a vehicle as a sunlight sensor for independently air-conditioning right and left seats of the vehicle. The sensor 3a is further used as an automatic lighting sensor for automatically turning on or off a headlamp of the vehicle. The sensor 3a in the present embodiment has the two functions described above. FIG. 21 shows relative sensitivities of this sensor with respect to an elevation, i.e., elevation characteristics.

Detailed explanation is below. Referring to FIG. 20, the sensor chip 3a has a circular center photo-detecting region (photodetector) 40, and arc-like photo-detecting regions (photodetectors) 41, 42, 43 provided around the region 40, and arc-like photo-detecting regions (photodetectors) 44, 45, 46 provided around the regions 41, 42, 43. The regions 40, 42, 45 are disposed on an axis $L_{CENT}$ as a reference when the azimuth is 0°. The axis $L_{CENT}$ extends in a front-rear direction of the vehicle. The arc-like photo-detecting regions 41, 42, 43 are separated from the circular photo-detecting region 40 at a specific distance d1. The regions 43, 46 compose a right side photodetector $D_R$, and the regions 41, 44 compose a left side photodetector $D_L$. The regions 42, 45 compose a first central photodetector $D_C1$ and the region 40 composes a second central photodetector $D_C2$.

As to detection of direction, the effect by a positional shift (assembling shift) between a shading member and the photodetectors is lessened by providing the inside arc-like photo-detecting regions 41–43 with respect to the outside arc-like photo-detecting regions 44–46. The effect by the assembling shift is further lessened by providing the circular photodetector 40 at the inside of the arc-like photo-detecting regions 41–43. Increasing the area of the circular photo-detecting region 40 effectuates to increase a permitted range of the assembling shift.

As described above, in the present embodiment, since several (three) central photodetectors $D_C$ are provided on the axis $L_{CENT}$, left side and right side light signals are less susceptible to the positional shift between the slit plate 5 and the photodetectors $D_L$, $D_R$ accompanying the offset of the slit 20 of the slit plate 5 from the axis $L_{CENT}$ as compared to the case where the left side and right side photodetectors $D_L$, $D_R$ are divided by the axis $L_{CENT}$ as shown in FIG. 22.

As to the elevation characteristics, the circular photo-detecting region 40 is used for directional characteristics (I) in FIG. 21, and the photo-detecting regions 40–46 are used for directional characteristics (II) in FIG. 21. The circular photo-detecting region 40 is common for obtaining the both characteristics (I), (II). The directional characteristics (I) has low output (sensitivity) at a small elevation, and high sensitivity at a large elevation. This directional characteristics (I) is used for automatic lighting. The directional characteristics (II) has a peak at a specific elevation (around 35° in FIG. 21), and is used for the sunlight sensor. The microcomputer 23 turns on or off the headlamp and the like of the vehicle using the directional characteristics (I), and air-conditions the right and left seats independently using the directional characteristics (II). Accordingly, one sensor can control several control targets (air conditioning unit and headlamp) with the multipurpose center element 40. The photodetectors 40–46 in the present embodiment are preferably composed of diodes.

On the other hand, referring again to FIG. 20, a region 47 provided at the vehicle front side along the axis $L_{CENT}$ has no photo-detecting region thereon, and a signal processing circuit is formed at the region 47 for processing the signals outputted from the photodetectors. Photoelectric currents produced by solar-radiation on the photo-detecting regions are processed in the signal processing circuit. The reason why no photo-detecting region is provided at the region 47 is because sunlight enters the region 47 not from the vehicle front side but from the vehicle rear side by the function of the slit 20 of the silt plate 5 and the optical lens 4.

Thus, although the region 47 is a dead space for the photo-detecting region, and does not contribute to the output characteristics of the sensor, the region 47 is effectively used to have the signal processing circuit therein. Accordingly, a region for holding the signal processing circuit, which has been provided at an outside of an annular photo-detecting region, can be omitted, resulting in size reduction. This is especially effective to a sensor including photodetectors and a signal processing circuit integrated therein.

In the present embodiment, although the first central photodetectors $D_C 1$ (regions 42, 45) and the second central photodetector $D_R 2$ (region 40) are separately provided to exhibit the two directional characteristics shown in FIG. 21, the region 40 may be connected to the regions 42, 45 provided that the elevation characteristics are not required. In the embodiments described above, each element is composed of a photo-diode; however, it may be composed of another element such as a phototransistor.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A sensor for detecting a quantity of light, comprising:
   a housing having a center axis along a direction in which light enters the sensor when an azimuth is zero with respect to said housing, the center axis dividing a surface of the housing into a first region and a second region;
   a light sensing portion disposed in said housing to sense incident light, including:
   a first photodetector disposed on the second region of the housing;
   a second photodetector disposed on the first region of the housing;
   a central photodetector disposed on both the first region and the second region of the housing across the axis, and desensitized upon output thereof in comparison with those of the first photodetector and the second photodetector, wherein the first, second and central photodetectors are arranged in an identical plane; and
   a shading member disposed above the sensing portion and having a light transmittance part and a shading part, so as to introduce light through the light transmittance part and determine an incident area in the sensing portion where the light is incident through the light transmittance and a non-incident area in the sensing portion where the light is not incident, wherein;
      the first photodetector and the central photodetector cooperatively detect a first quantity of light entering the sensor from a side of the first region with respect to the axis; and
      the second photodetector and the central photodetector cooperatively detect a second quantity of light entering the sensor from a side of the second region with respect to the axis.

2. The sensor of claim 1, further comprising a signal processing circuit for processing first, second, and third signals respectively outputted from the first photodetector, the second photodetector, and the central photodetector, wherein:
   the third signal from the central photodetector is desensitized with respect to the first and second signals to produce first and second desensitized signals in said signal processing circuit, and the first and second desensitized signals are added to the first signal and the second signal, respectively.

3. The sensor of claim 1, wherein the central photodetector includes a first central photodetector and a second central photodetector, each of which is disposed on both the first region and the second region of the housing across the axis.

4. The sensor of claim 3, wherein:
   the first photodetector, the second photodetector, and the first central photodetector form an annular shape which has a central point on the axis; and
   the second central photodetector is disposed on the central point.

5. The sensor of claim 4, wherein the second central photodetector has a circular shape.

6. The sensor of claim 1, wherein the housing has a specific point on the axis, the specific point defining an approximately identical distance from the first photodetector, the second photodetector, and the central photodetector.

7. The sensor of claim 1, wherein the central photodetector has a shape symmetrical with respect to the axis.

8. The sensor of claim 1, wherein an output signal outputted from the central photodetector determines an information related to azimuth of the light entering said sensor cooperatively with output signals respectively outputted from the first photodetector and the second photodetector.

9. A sensor for detecting a quantity of light incident on a vehicle, comprising:
   a housing having an axis along a front and rear direction of the vehicle in which light enters the sensor when an azimuth is zero with respect to said housing, the axis dividing a surface of the housing into a first region and a second region;
   a first photodetector disposed on the second region of the housing, for outputting a first signal corresponding to a quantity of light incident thereon;
   a second photodetector disposed on the first region of the housing, for outputting a second signal corresponding to a quantity of light incident thereon;
   a central photodetector disposed on both the first region and the second region of the housing across the axis, and desensitized upon output thereof in comparison with those of the first photodetector and the second photodetector, for outputting a third signal corresponding to a quantity of light incident thereon, wherein the first, second and central photodetectors are arranged in an identical plane;
   a shading member disposed above the first and second photodetectors and having a light transmittance part and a shading part, so as to introduce light through the light transmittance part and determine an incident area in the first, second and central photodetectors where the light is incident through the light transmittance and a non-incident area in the first, second and central photodetectors where the light is not incident; and
   a signal processing circuit provided on the housing for determining a first quantity of light entering the sensor from a side of the first region based on the first signal and the third signal, and for determining a second quantity of light entering the sensor from a side of the second region based on the second signal and the third signal.

10. The sensor of claim 9, wherein the signal processing circuit is provided at a front side of the vehicle with respect to the central photodetector.

11. The sensor of claim 10, wherein:
    the first photodetector, the second photodetector, and the central photodetector form an annular shape having a notched portion at the front side of the vehicle; and
    the signal processing circuit is provided at the notched portion.

12. The sensor of claim 10, wherein the light transmittance part of the shading member is disposed above a portion of the housing, the portion is located at a rear side of the vehicle with respect to the signal processing circuit.

13. The sensor of claim 9, wherein an output signal outputted from the central photodetector determines an information related to azimuth of the light entering said sensor cooperatively with output signals respectively outputted from the first photodetector and the second photodetector.

14. The sensor of claim 9, wherein the third signal from the central photodetector is desensitized with respect to the first and second signals to produce first and second desensitized signals in said signal processing circuit, and the first and second desensitized signals are added to the first signal and the second signal, respectively.

15. A sensor for detecting a quantity of light, comprising:
a housing having a center axis along a direction in which light enters the sensor when the azimuth is zero with respect to said housing, the center axis dividing a surface of the housing into a first region and a second region;
a first photodetector for detecting a first quantity of light entering the sensor from a side of the first region, the first photodetector having a first main portion entirely disposed on the second region and a plurality of first protrusions protruding from the first main portion toward the first region across the center axis; and
a second photodetector for detecting a second quantity of light entering the sensor from a side of the second region, the second photodetector having a second main portion entirely disposed on the first region and having a plurality of second protrusions protruding from the second main portion toward the second region across the center axis; and
a shading member disposed above the first and second photodetectors and having a light transmittance part and a shading part, so as to introduce light through the light transmittance part and determine an incident area in the first and second photodetectors where the light is incident through the light transmittance and a non-incident area in the first and second photodetectors where the light is not incident;

wherein:
the first main portion has a first predetermined width to be entirely disposed at the second region, and the first main portion is a first common portion to which said plurality of first protrusions are connected;
the plurality of first protrusions has a first width to extend from the second region to the first region;
the second main portion has a second predetermined width to be entirely disposed at the first region, and the second main portion is a second common portion to which said plurality of second protrusions are connected; and
the plurality of second protrusions has a second width to extend from the first region to the second region.

16. The sensor of claim 15, wherein the first width is approximately equal to the second width.

17. The sensor of claim 15, wherein the plurality of first protrusions and the plurality of second protrusions are alternately disposed along the center axis.

18. The sensor of claim 15, wherein:
the plurality of first protrusions form a zigzag side of the first photodetector; and
the plurality of second protrusions form a zigzag side of the second photodetector facing the zigzag side of the first photodetector.

19. The sensor of claim 15, wherein the first and second widths are set at such a degree to be the same as the first and second predetermined widths.

* * * * *